United States Patent
Oh

(10) Patent No.: US 11,387,154 B2
(45) Date of Patent: Jul. 12, 2022

(54) MEMORY DEVICE, MEMORY SYSTEM INCLUDING THE SAME AND METHODS OF OPERATION

(71) Applicant: SK hynix Inc., Icheon-si (KR)

(72) Inventor: Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 146 days.

(21) Appl. No.: 16/935,351

(22) Filed: Jul. 22, 2020

(65) Prior Publication Data
US 2021/0257266 A1    Aug. 19, 2021

(30) Foreign Application Priority Data
Feb. 19, 2020  (KR) .................. 10-2020-0020535

(51) Int. Cl.
*H01L 21/66*     (2006.01)
*H01L 23/00*     (2006.01)
*G01R 31/317*    (2006.01)
*H01L 25/18*     (2006.01)

(52) U.S. Cl.
CPC ........ *H01L 22/32* (2013.01); *G01R 31/31717* (2013.01); *H01L 24/06* (2013.01); *H01L 25/18* (2013.01); *H01L 2224/06181* (2013.01); *H01L 2924/1434* (2013.01)

(58) Field of Classification Search
CPC ......... H01L 22/32; H01L 24/06; H01L 25/18; H01L 2224/06181; H01L 2924/1434; H01L 2224/08145; H01L 2225/06562; H01L 23/528; G01R 31/31717; G11C 29/1201; G11C 29/006
See application file for complete search history.

(56) References Cited

U.S. PATENT DOCUMENTS

| | | | | |
|---|---|---|---|---|
| 2005/0223289 A1* | 10/2005 | Ho | ............... | G11C 29/12 714/30 |
| 2007/0030017 A1* | 2/2007 | Choi | ............... | G01R 1/06794 324/750.24 |
| 2007/0159203 A1* | 7/2007 | Banno | ............... | G01R 31/31721 324/762.05 |
| 2009/0175113 A1* | 7/2009 | Deng | ............... | G11C 29/50 365/230.01 |
| 2019/0206845 A1* | 7/2019 | Ito | ............... | G11C 5/04 |
| 2021/0082779 A1* | 3/2021 | Chen | ............... | H01L 23/585 |

FOREIGN PATENT DOCUMENTS

| | | | |
|---|---|---|---|
| KR | 10-2012-0052555 A | 5/2012 | |
| KR | 10-2014-0008174 A | 1/2014 | |

* cited by examiner

*Primary Examiner* — Alvaro E Fortich
*Assistant Examiner* — Zannatul Ferdous

(57) ABSTRACT

A memory device includes a first wafer including a first bonding pad disposed on a first surface; a second wafer, including a second bonding pad disposed on a second surface of the second wafer, the second surface of the second wafer bonded on the first surface of the first wafer; and a first test pattern. The first test pattern includes a pair of first test pads disposed on the first surface and electrically coupled to each other; a pair of second test pads disposed on the second surface of the second wafer and respectively coupled to the pair of first test pads, when no misalignment failure between the first bonding pad and the second bonding pad occurs; and a pair of third test pads disposed on a third surface of the second wafer, which is opposite to the second surface, and respectively coupled to the pair of second test pads.

20 Claims, 23 Drawing Sheets

MEMORY DEVICE, MEMORY SYSTEM INCLUDING THE SAME AND METHODS OF OPERATION

CROSS-REFERENCE TO RELATED APPLICATION

The present application claims priority under 35 U.S.C. § 119(a) to Korean Patent Application No. 10-2020-0020535 filed in the Korean Intellectual Property Office on Feb. 19, 2020, which is incorporated herein by reference in its entirety.

BACKGROUND

1. Technical Field

Various embodiments generally relate to semiconductor technology, and more particularly, to a memory device, a memory system including the same and methods of operation.

2. Related Art

Recently, in order to reduce the occupation area of a memory device, methods are used in which elements configuring the memory device are fabricated on separate wafers, rather than being fabricated on a single wafer, and then bonded to each other.

SUMMARY

Various embodiments are directed to a memory device and a memory system capable of contributing to improvement in reliability.

An aspect of the present disclosure provides a memory device with bonded wafers having structures that facilitate testing for wafer misalignment. In an embodiment, a memory device comprises a first wafer including a first bonding pad disposed on a first surface; a second wafer, including a second bonding pad disposed on a second surface of the second wafer and corresponding to the first bonding pad, the second surface of the second wafer bonded on the first surface of the first wafer; and a first test pattern, the first test pattern comprising a pair of first test pads disposed the first surface and electrically coupled to each other; a pair of second test pads disposed on the second surface of the second wafer and respectively coupled to the pair of first test pads, when no misalignment failure between the first bonding pad and the second bonding pad occurs; and a pair of third test pads disposed a third surface of the second wafer, which is opposite to the second surface, and respectively coupled to the pair of second test pads.

In an aspect of the disclosure, a memory system may include structural elements that can mitigate a voltage drop representative if a wafer misalignment by providing a boost voltage. In an embodiment, a memory system may comprise a memory device; and a memory controller, the memory device comprising a first wafer including a first bonding pad disposed on a first surface; a second wafer, including a second bonding pad disposed on a second surface of the second wafer corresponding to the first bonding pad, bonded on the first wafer such that the second bonding pad is aligned to the first bonding pad; and a first test pattern, the first test pattern comprising a pair of first test pads disposed on the first surface and electrically coupled to each other; a pair of second test pads disposed on the second surface of the second wafer and respectively coupled to the pair of first test pads; and a pair of third test pads disposed on a third surface of the second wafer, which is opposite to the second surface, and respectively coupled to the pair of second test pads, wherein the memory controller applies a test voltage to one of the pair of third test pads and generates a power-up signal based on a ratio between a detection voltage measured from the other third test pad and the test voltage, and wherein the first wafer provides a boosted voltage to the first bonding pad in response to the power-up signal.

In an embodiment, a method of detecting a pad misalignment in a memory device comprising: providing the memory device. The memory device includes a first wafer including a first bonding pad disposed on a first surface; a second wafer, including a second bonding pad disposed on a second surface of the second wafer and corresponding to the first bonding pad, the second surface of the second wafer bonded on the first surface of the first wafer; and a first test pattern. The first test pattern comprising: a pair of first test pads disposed on the first surface and electrically coupled to each other; a pair of second test pads disposed on the second surface of the second wafer and respectively coupled to the pair of first test pads; and a pair of third test pads disposed on a third surface of the second wafer, which is opposite to the second surface, and respectively coupled to the pair of second test pads. The method of detecting a pad misalignment in a memory device further comprising: applying a test signal to one of the pair of third test pads; measuring an output signal from the other of the pair of third test pads; and detecting a pad misalignment based on the output signal.

In an embodiment, a method of boosting voltage in a memory device with misaligned wafers, comprising: providing the memory device. The memory device includes a first wafer including a first bonding pad disposed on a first surface; a second wafer, including a second bonding pad disposed on a second surface of the second wafer and corresponding to the first bonding pad, the second surface of the second wafer bonded on the first surface of the first wafer; and a first test pattern. The first test pattern comprising: a pair of first test pads disposed on the first surface and electrically coupled to each other; a pair of second test pads disposed on the second surface of the second wafer and respectively coupled to the pair of first test pads; and a pair of third test pads disposed on a third surface of the second wafer, which is opposite to the second surface, and respectively coupled to the pair of second test pads. The method of boosting voltage in a memory device with misaligned wafers, further comprising: applying a test voltage to one of the pair of third test pads; measuring an output voltage from the other of the pair of third test pads; determining a ratio between the test voltage and the output voltage; generating a power-up signal based on the ratio, providing a boost voltage to the first bonding pad.

DETAILED DESCRIPTION

Figure 1:
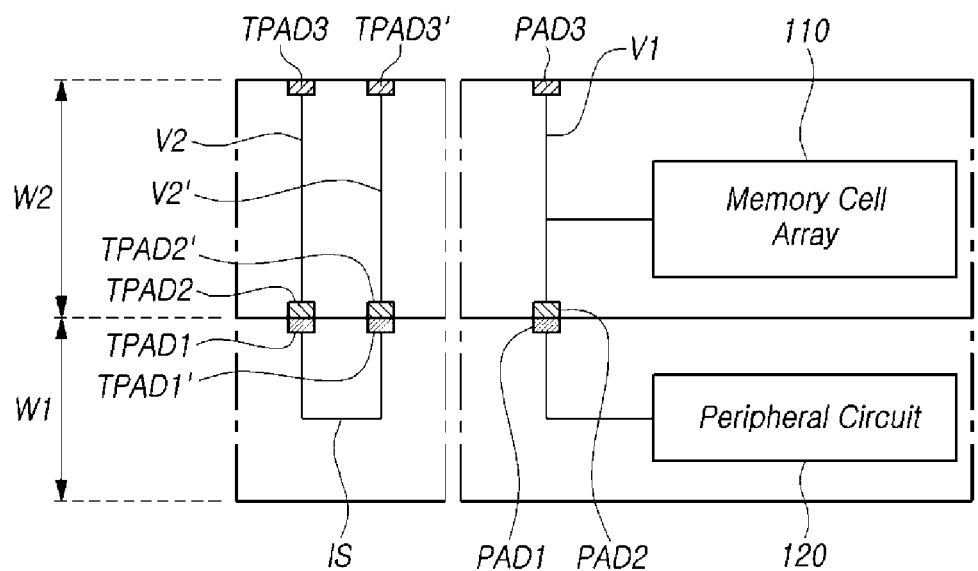
FIG. 1 is a cross-sectional view schematically illustrating a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a cross-sectional view schematically illustrating a memory device in accordance with an embodiment of the disclosure.

Referring to FIG. 1, a memory device may include a first wafer W1 and a second wafer W2 that is stacked on the first wafer W1. For example, the first wafer W1 may be a peripheral wafer, and the second wafer W2 may be a cell wafer. The second wafer W2 may include a memory cell array 110, and the first wafer W1 may include a peripheral circuit 120 for controlling the operation of the memory cell array 110. The peripheral circuit 120 may include, for example, a row decoder, a page buffer circuit, a data input/output circuit, a control logic, a voltage generator, and so forth.

The first wafer W1 may include, on one surface thereof, a first bonding pad PAD1 which is coupled to the peripheral circuit 120. The second wafer W2 may include, on a first surface thereof, a second bonding pad PAD2 which is coupled to the memory cell array 110, and may include, on a second surface thereof facing away from the first surface, a third bonding pad PAD3. The second bonding pad PAD2 and the third bonding pad PAD3 may be coupled to each other through a through via V1 that traverses the second wafer W2. For the sake of simplicity in illustration, FIG. 1 illustrates only one each of the first to third bonding pads PAD1 to PAD3, but it is to be understood that embodiments contemplated by the disclosure may have more than one of each of the first to third bonding pads PAD1 to PAD3.

The second wafer W2 may be stacked on the one surface of the first wafer W1 such that the second bonding pad PAD2 is coupled to the first bonding pad PAD1. When the wafers W1 and W2 are stacked, a failure in which the first bonding pad PAD1 and the second bonding pad PAD2 are not coupled (hereinafter, referred to as a "pad misalignment failure") may occur. In order to improve the reliability of a product, it is necessary to detect a pad misalignment failure so as to prevent fabrication of a memory device with a pad misalignment failure that would be rejected. Embodiments of the disclosure suggest a memory device capable of detecting a pad misalignment failure and methods of operating such devices.

Referring back to FIG. 1, the first wafer W1 may include a pair of first test pads TPAD1 and TPAD1' on the one surface on which the first bonding pad PAD1 is also defined. The second wafer W2 may include, on the first surface thereof, a pair of second test pads TPAD2 and TPAD2' corresponding to the pair of first test pads TPAD1 and TPAD1', and may include, on the second surface thereof, a pair of third test pads TPAD3 and TPAD3' that are coupled to the pair of second test pads TPAD2 and TPAD2', respectively.

The pair of first test pads TPAD1 and TPAD1' may be coupled to each other through an interconnect structure IS that is defined in the first wafer W1. The second test pad TPAD2 and the third test pad TPAD3 may be coupled to each other by a through via V2, which traverses the second wafer W2 in a vertical direction. The second test pad TPAD2' and the third test pad TPAD3' may be coupled to each other with a through via V2', which traverses the second wafer W2 in the vertical direction.

The first test pads TPAD1 and TPAD1', the interconnect structure IS, the second test pads TPAD2 and TPAD2', the third test pads TPAD3 and TPAD3' and the through vias V2 and V2' may constitute a first test pattern TS1 for detecting a pad misalignment failure between the first wafer W1 and the second wafer W2.

If a pad misalignment failure does not occur when the second wafer W2 is stacked on the first wafer W1, then the second bonding pad PAD2 of the second wafer W2 will be coupled to the first bonding pad PAD1 of the first wafer W1. Further, the second test pad TPAD2 of the second wafer W2 will be coupled to the first test pad TPAD1 of the first wafer W1, and the second test pad TPAD2' of the second wafer W2 will be coupled to the first test pad TPAD1' of the first wafer W1.

Accordingly, an electrical path may be configured that couples elements constituting the first test pattern TS1, that is, the third test pad TPAD3, the through via V2 and the second test pad TPAD2 of the second wafer W2, the first test pad TPAD1, the interconnect structure IS and the first test pad TPAD1' of the first wafer W1, and the second test pad TPAD2', the through via V2' and the third test pad TPAD3' of the second wafer W2.

Manufacturing problems may arise when separate processes are introduced to form the first test pattern TS1 because a separate process increases the number of manufacturing steps, resulting in increases in manufacturing time and cost. In addition, separate manufacturing processes increase the probability of a manufacturing failure. In order to form the first test pattern TS1 without such problems, the first test pattern TS1 may be manufactured by utilizing processes for forming other components in the wafers W1 and W2, without introducing one or more separate processes. For example, the first test pads TPAD1 and TPAD1' may be formed by utilizing the same process for forming the first bonding pad PAD1. Accordingly, the first test pads TPAD1 and TPAD1' may be formed of the same material as the first bonding pad PAD1. The second test pads TPAD2 and TPAD2' may be formed by utilizing the same process for forming the second bonding pad PAD2, and may be formed of the same material as the second bonding pad PAD2. The third test pads TPAD3 and TPAD3' may be formed by utilizing the same process for forming the third bonding pad PAD3, and may be formed of the same material as the third bonding pad PAD3. The through vias V2 and V2' may be formed by utilizing the same process for forming the through via V1, and may be formed of the same material as the through via V1.

Figure 2:
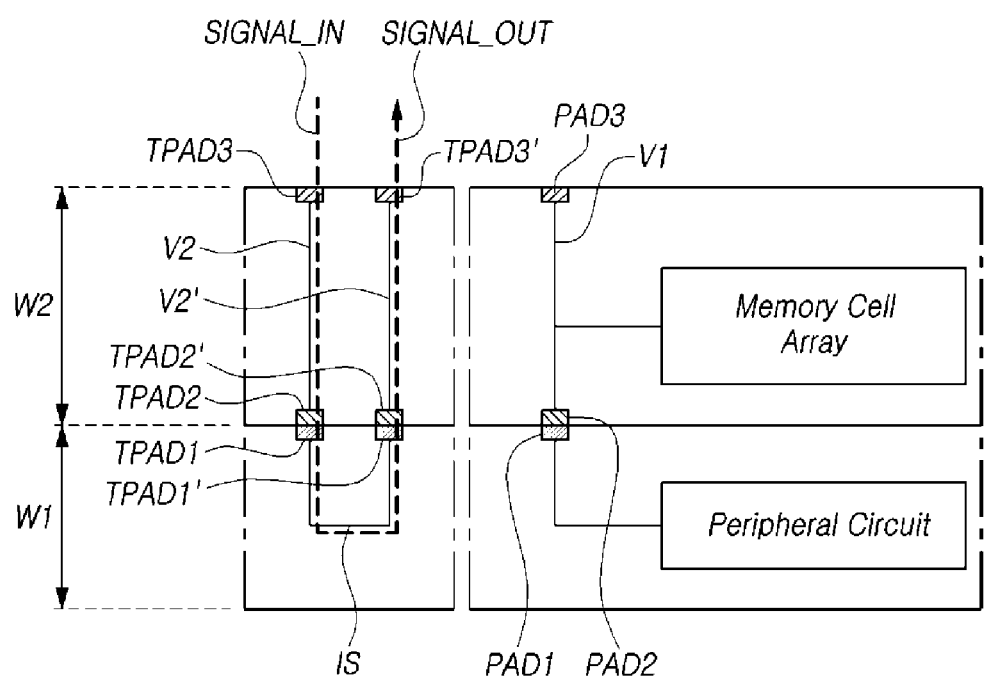
FIG. 2 is a diagram illustrating the flow of a test signal in a memory device of FIG. 1 without a pad misalignment failure.
Figure 3:
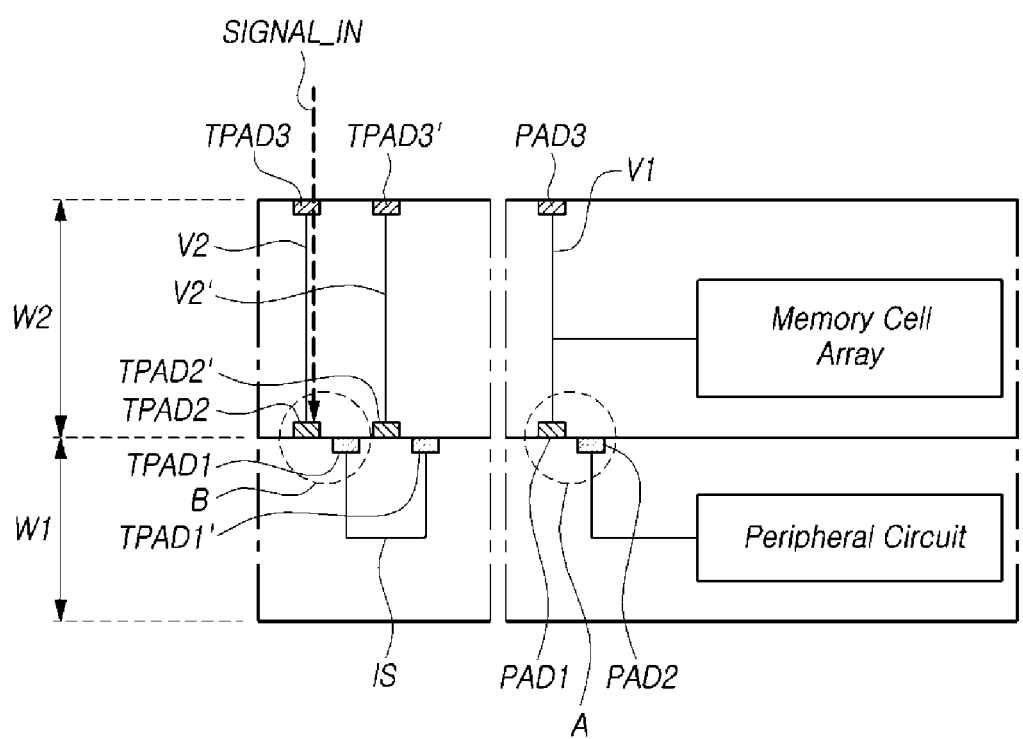
FIG. 3 is a diagram illustrating the flow of a test signal in a memory device of FIG. 1 with a pad misalignment failure.

FIG. 2 is a diagram illustrating the flow of a test signal in a memory device of FIG. 1 without a pad misalignment failure. FIG. 3 is a diagram illustrating the flow of a test signal in a memory device of FIG. 1 with a pad misalignment failure.

Referring to FIG. 2, when a pad misalignment failure is tested, a test signal SIGNAL_IN may be applied to the third test pad TPAD3 of the second wafer W2. In the case where a pad misalignment failure does not occur, the second test pad TPAD2 of the second wafer W2 and the first test pad TPAD1 of the first wafer W1 may be coupled to each other and the second test pad TPAD2' of the second wafer W2 and the first test pad TPAD1' of the first wafer W1 may be coupled to each other. An electrical path is configured in which the third test pad TPAD3 and the third test pad TPAD3' are coupled to each other. Accordingly, the test signal SIGNAL_IN applied to the third test pad TPAD3 will be transferred to the third test pad TPAD3' via the electrical path, and thus, a signal SIGNAL_OUT will be detected from the third test pad TPAD3'. Due to the load of the electrical path, the signal SIGNAL_OUT detected from the third test pad TPAD3' may have a magnitude that is reduced when compared to that of the test signal SIGNAL_IN applied to the third test pad TPAD3.

FIG. 3 illustrates a pad misalignment failure when the second wafer W2 is stacked on the first wafer W1. In this case, the second bonding pad PAD2 of the second wafer W2 may not be coupled to the first bonding pad PAD1 of the first wafer W1 (see part 'A'). In addition, as illustrated in part B, the second test pad TPAD2 of the second wafer W2 and the first test pad TPAD1 of the first wafer W1 will not be coupled to each other. Accordingly, the test signal SIGNAL_IN applied to the third test pad TPAD3 of the second wafer W2 is not transferred to the third test pad TPAD3', and no signal will be detected from the third test pad TPAD3'.

According to embodiments disclosed herein, it is possible to test a pad misalignment failure by simply applying the test signal SIGNAL_IN to the third test pad TPAD3 of the second wafer W2 and checking whether the signal SIGNAL_OUT is detected from the third test pad TPAD3' of the second wafer W2.

While the present disclosure illustrates cases in which one second wafer W2 is stacked on the first wafer W1, it is to be noted that the disclosure is not limited thereto. The number of second wafers W2 to be stacked may be two or more. In embodiments where the number of second wafers W2 to be stacked is two or more, it is possible to test a pad misalignment failure among stacked wafers by applying the test signal SIGNAL_IN to the third test pad TPAD3 of an uppermost second wafer W2 and checking whether the signal SIGNAL_OUT is detected from the third test pad TPAD3' of the uppermost second wafer W2.

Figure 4:
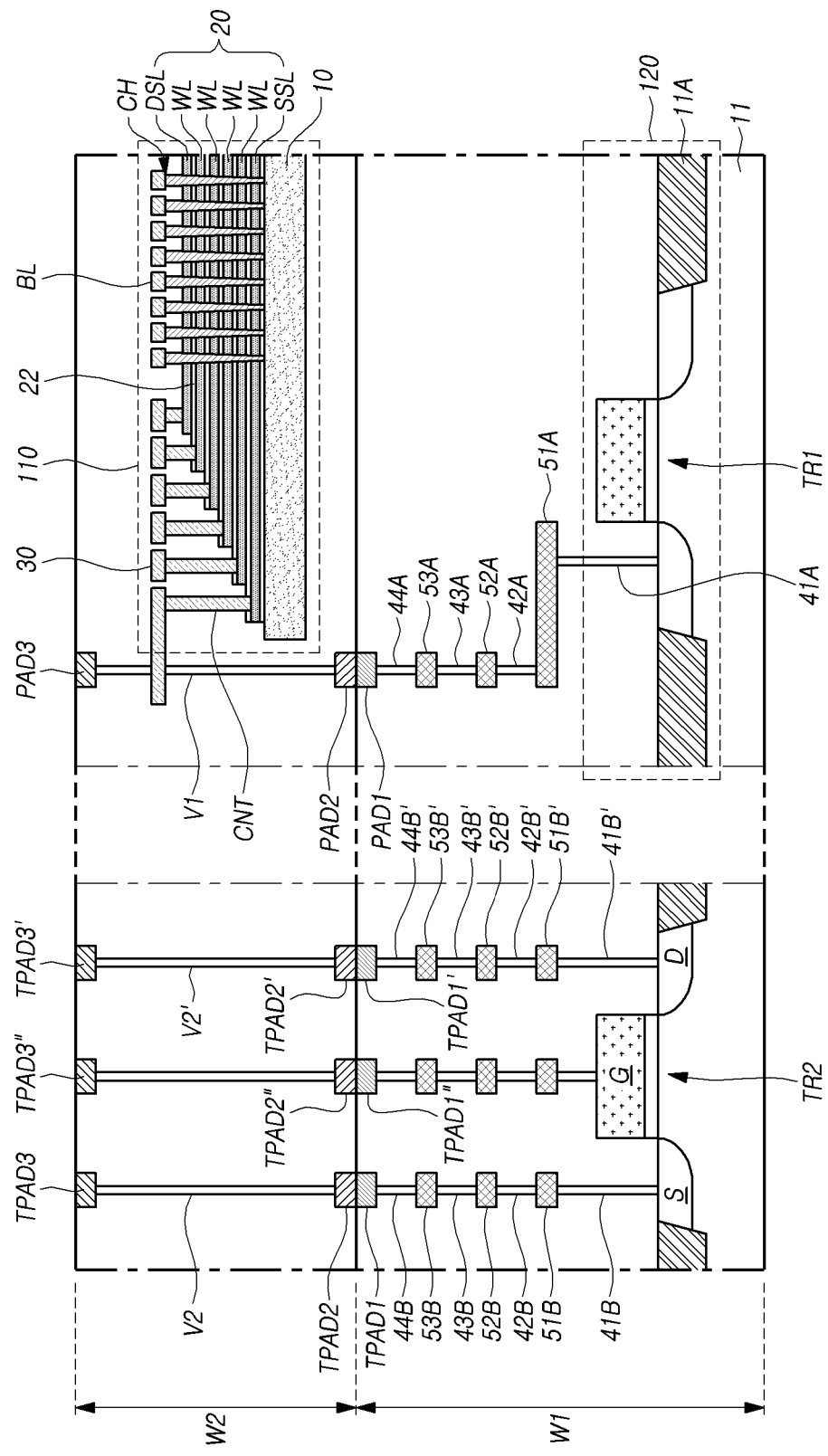
FIG. 4 is a cross-sectional view illustrating details of a memory device illustrated in FIG. 1.

FIG. 4 is a cross-sectional view illustrating details of a memory device illustrated in FIG. 1.

Referring to FIG. 4, a memory cell array 110 of a second wafer W2 may include a source plate 10, and electrode layers 20 and interlayer dielectric layers 22, which are alternately stacked on the source plate 10. The electrode layers 20 may include word lines WL and select lines SSL and DSL. At least one electrode layer 20, from among the lowermost electrode layers 20, may constitute a source select line SSL, and at least one electrode layer 20, from among the uppermost electrode layers 20, may constitute a drain select line DSL. The electrode layers 20 between the source select line SSL and the drain select line DSL may be word lines WL.

A plurality of vertical channels CH passing vertically through the electrode layers 20 and the interlayer dielectric layers 22 may be defined in the second wafer W2. While not illustrated, each of the vertical channels CH may include a channel layer and a gate dielectric layer. The channel layer may include polysilicon or monocrystalline silicon, and may include a P-type impurity such as boron (B) in some regions thereof. The gate dielectric layer may have the shape of a straw or a cylindrical shell which surrounds the outer wall of the channel layer. The gate dielectric layer may include a tunnel dielectric layer, a charge storage layer and a blocking layer which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured where the source select line SSL surrounds the vertical channels CH. Memory cells may be configured where the word lines WL surround the vertical channels CH. Drain select transistors may be configured where the drain select line DSL surrounds the vertical channels CH. Bit lines BL may be defined over the vertical channels CH, and may be coupled to the vertical channels CH.

The electrode layers 20 and the interlayer dielectric layers 22 may extend in a horizontal direction in different lengths to form a step structure. Contacts CNT may be extended in a vertical direction through the interlayer dielectric layers 22 to be coupled to the electrode layers 20 in the step structure, respectively. Wiring lines 30 may be coupled to the top ends of the contacts CNT, respectively. The through via V1 may be coupled to one of the electrode layers 20 through the wiring line 30 and the contact CNT.

A first wafer W1 may include a substrate 11 and a peripheral circuit 120, which is defined on the substrate 11. The peripheral circuit 120 may include a transistor TR1 that is defined in an active region of the substrate 11 defined by an isolation layer 11A. FIG. 4 illustrates a structure in which the transistor TR1 defined in the first wafer W1 is coupled to an electrode layer 20 defined in the second wafer W2. The transistor TR1 may constitute a row decoder. A first bonding pad PAD1 of the first wafer W1 may be coupled to the peripheral circuit 120 through contacts 41A to 44A and wiring lines 51A to 53A.

A first test pad TPAD1 and a first test pad TPAD1' may be coupled through a switching transistor TR2. The switching transistor TR2 may be fabricated by utilizing a manufacturing process, which may be the same process, used to fabricate the transistor TR1, which constitutes the peripheral circuit 120. The first test pad TPAD1 may be coupled to a source region S of the switching transistor TR2 through contacts 41B to 44B and wiring lines 51B to 53B, and the first test pad TPAD1' may be coupled to a drain region D of the switching transistor TR2 through contacts 41B' to 44B' and wiring lines 51B' to 53B'.

The contacts 41B and 41B' may be fabricated by utilizing a manufacturing process, which may be the same process, used to fabricate the contact 41A, which couples the first bonding pad PAD1 and the peripheral circuit 120. Similarly, the contacts 42B and 42B' may be fabricated by utilizing a manufacturing process of the contact 42A, the contacts 43B and 43B' may be fabricated by utilizing a manufacturing process, which may be the same process, used to fabricate the contact 43A, and the contacts 44B and 44B' may be fabricated by utilizing a manufacturing process, which may be the same process, used to fabricate the contact 44A. The wiring lines 51B and 51B' may be fabricated by utilizing a manufacturing process, which may be the same process, used to fabricate the wiring line 51A, which is couples the first bonding pad PAD1 and the peripheral circuit 120. Similarly, the wiring lines 52B and 52B' may be fabricated by utilizing a manufacturing process, which may be the same process, used to fabricate the wiring line 52A, and the wiring lines 53B and 53B' may be fabricated by utilizing a manufacturing process, which may be the same process, used to fabricate the wiring line 53A. The switching transistor TR2 may constitute the interconnect structure IS (see FIG. 1), which couples the first test pad TPAD1 and the first test pad TPAD1'.

When a pad misalignment failure is tested, a turn-on voltage may be applied to a gate G of the switching transistor TR2, and thereby, the switching transistor TR2 may be turned on. When a pad misalignment failure is not tested, the gate G of the switching transistor TR2 may be floated, and accordingly, the switching transistor TR2 may be turned off. In order to apply the turn-on voltage to the gate G of the switching transistor TR2, the first wafer W1 may include, on one surface thereof, an additional first test pad TPAD1" that is coupled to the gate G of the switching transistor TR2, and the second wafer W2 may include, on a first surface thereof, an additional second test pad TPAD2" that corresponds to the additional first test pad TPAD1". The second wafer W2 may include, on a second surface thereof, an additional third test pad TPAD3" that is coupled to the additional second test pad TPAD2".

Thus, methods of testing for pad misalignment failures in devices of embodiments of the disclosure are also described herein with reference to FIGS. 1 to 6 and contemplated by the disclosure. Furthermore, manufacturing problems may be caused when one or more separate processes are introduced to form an interconnect structure because a separate process increases the number of manufacturing steps, resulting in increases in manufacturing time and cost. In addition, separate manufacturing processes increase the probability of a manufacturing failure. According to embodiments contemplated by the disclosure, an interconnect structure may be configured as a switching transistor TR2 that is fabricated utilizing one or more processes for forming the transistor TR1 of the peripheral circuit 120, without introducing separate processes to form the interconnect structure. Therefore, because it is not necessary to introduce a separate process to form the interconnect structure, it is possible to reduce manufacturing time and cost, as well as suppress or reduce failures likely to occur during a manufacturing process.

Figure 5:
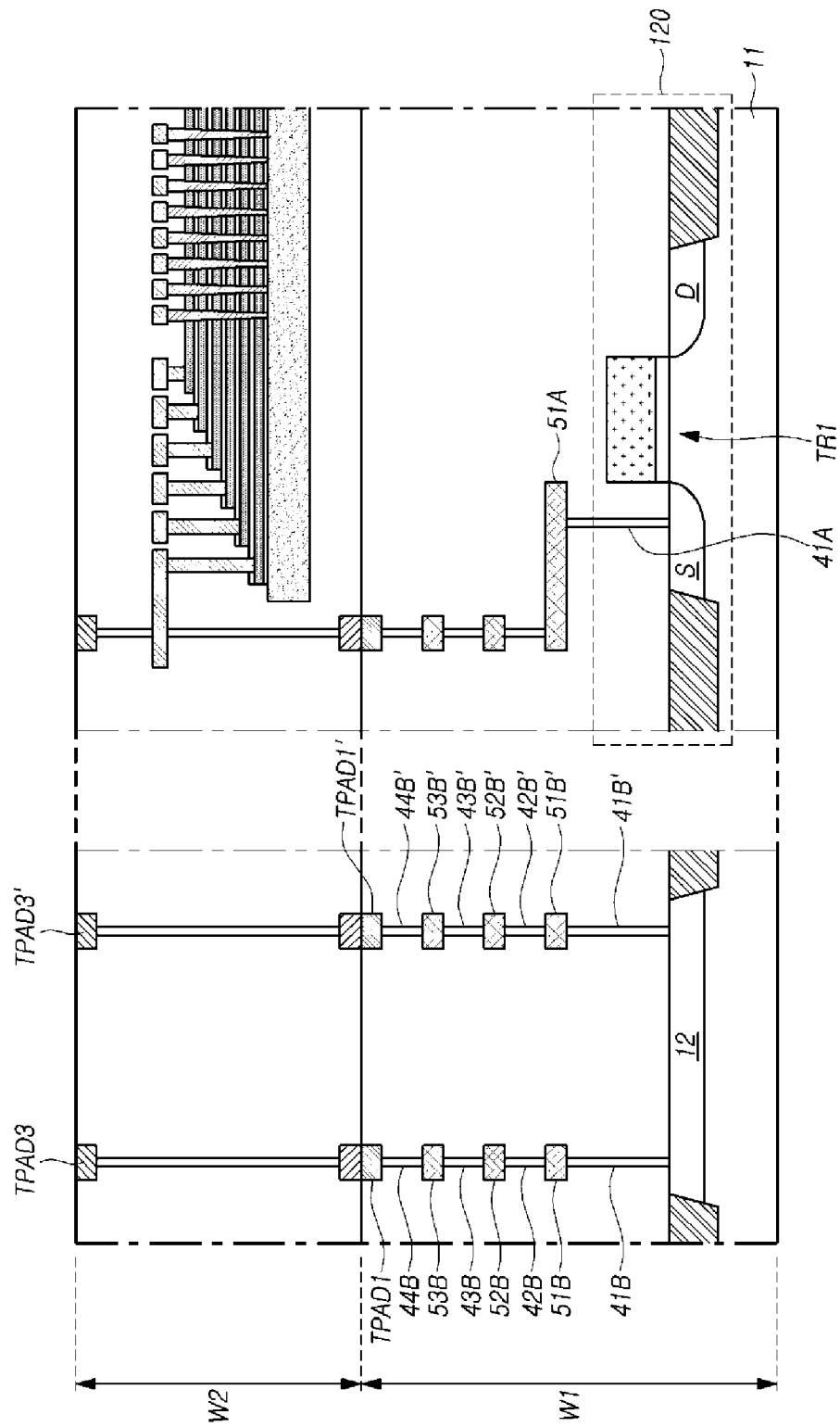
FIGS. 5 and 6 are cross-sectional views illustrating examples of interconnect structures.
Figure 6:
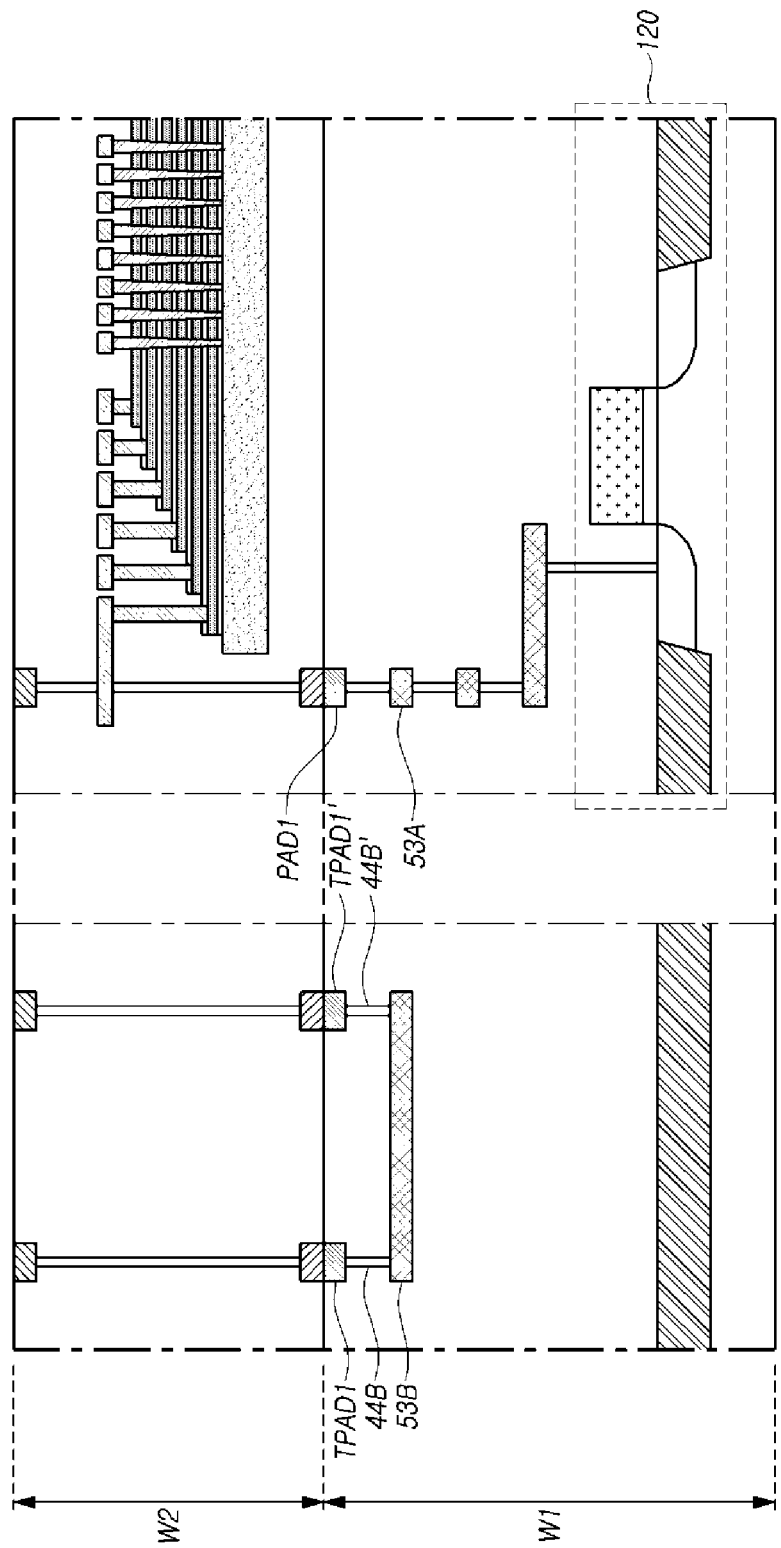

FIGS. 5 and 6 are cross-sectional views illustrating examples of interconnect structures.

Referring to FIG. 5, a first test pad TPAD1 and a first test pad TPAD1' may be coupled to each other through a semiconductor layer 12, which is defined in a substrate 11 in a first wafer W1. The semiconductor layer 12 may be fabricated by utilizing an impurity implantation process for forming a source region S and a drain region D of a transistor TR1, which constitutes the peripheral circuit 120. The first test pad TPAD1 may be coupled to one end of the semiconductor layer 12 through contacts 41B to 44B and wiring lines 51B to 53B. The first test pad TPAD1' may be coupled to the other end of the semiconductor layer 12 through contacts 41B' to 44B' and wiring lines 51B' to 53B'. The semiconductor layer 12 may constitute an interconnect structure IS (see FIG. 1) that couples the first test pad TPAD1 and the first test pad TPAD1'.

Referring to FIG. 6, a first test pad TPAD1 and a first test pad TPAD1' may be coupled to each other through a wiring line 53B. The wiring line 53B may be fabricated by utilizing a manufacturing process, which may be the same process, used to fabricate a wiring line 53A, which couples a peripheral circuit 120 and a first bonding pad PAD1. The first test pad TPAD1 may be coupled to one end of the wiring line 53B through a contact 44B, and the first test pad TPAD1' may be coupled to the other end of the wiring line 53B through a contact 44B'. The wiring line 53B may constitute an interconnect structure IS (see FIG. 1) that couples the first test pad TPAD1 and the first test pad TPAD1'.

Figure 7:
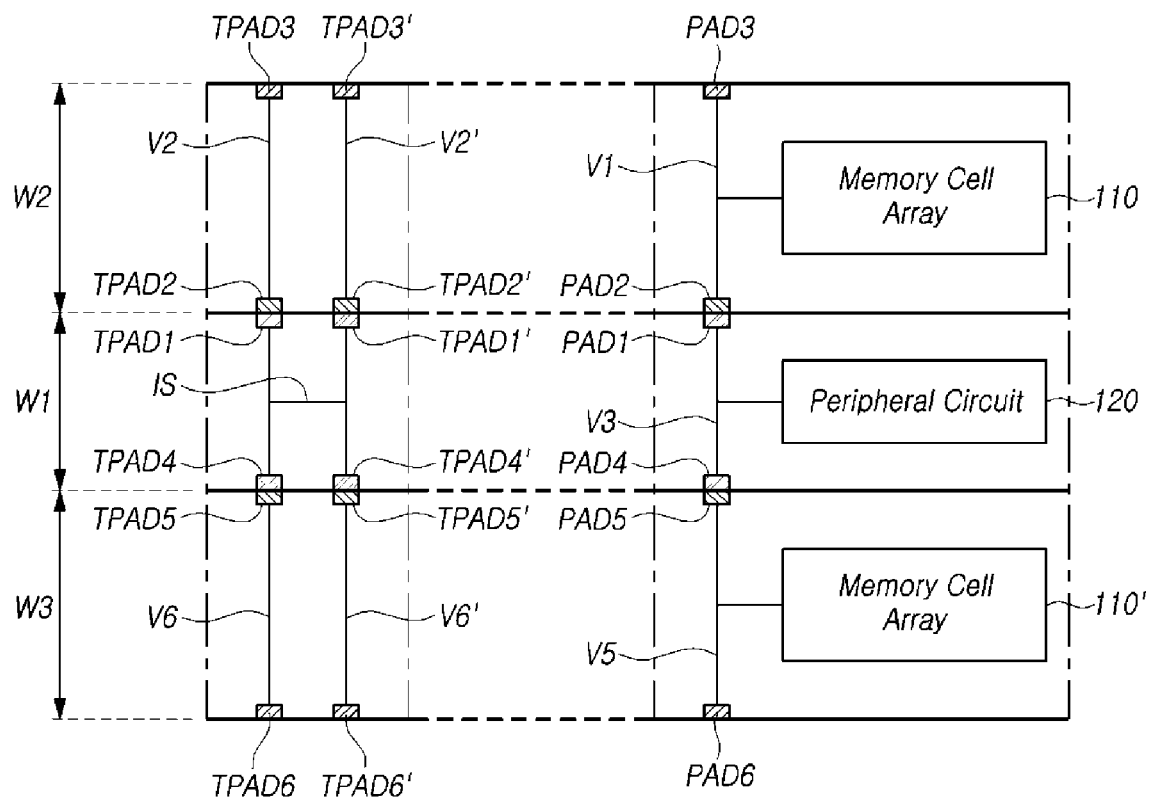
FIG. 7 is a cross-sectional view schematically illustrating a memory device in accordance with another embodiment of the disclosure.

FIG. 7 is a cross-sectional view schematically illustrating a memory device in accordance with another embodiment of the disclosure. In the descriptions below with reference to FIGS. 7 to 13, elements that are substantially similar to elements in embodiments described above with reference to FIGS. 1 through 6 may be omitted from the description for convenience of explanation.

Referring to FIG. 7, a third wafer W3 may be additionally stacked on the other second surface of the first wafer W1, facing away from the one first surface of the first wafer W1 on which the second wafer W2 is stacked. For example, the third wafer W3 may be a cell wafer that includes a memory cell array 110'.

The first wafer W1 may include, on the second surface, a fourth bonding pad PAD4 that is coupled to the peripheral circuit 120. The fourth bonding pad PAD4 may be coupled to the first bonding pad PAD1 with a through via V3 that traverses the first wafer W1 in the vertical direction. The first wafer W1 may include, on the second surface, a pair of fourth test pads TPAD4 and TPAD4'. The pair of fourth test pads TPAD4 and TPAD4' may be coupled to each other through the interconnect structure IS.

In FIG. 7, the first test pads TPAD1 and TPAD1' and the fourth test pads TPAD4 and TPAD4' are coupled in common to, and therefore share, one interconnect structure IS, but it is to be noted that embodiments contemplated by the disclosure are not limited thereto. The fourth test pads TPAD4 and TPAD4' may be coupled to the first test pads TPAD1 and TPAD1' by using a separate interconnect structure.

The third wafer W3 may include, on a first surface, a fifth bonding pad PAD5 that is coupled to the memory cell array 110', and may include, on a second surface facing away from the first surface, a sixth bonding pad PAD6 that is coupled to the memory cell array 110'. The fifth bonding pad PAD5 and the sixth bonding pad PAD6 may be coupled to each other with a through via V5 that traverses the third wafer W3 in the vertical direction.

The third wafer W3 may include, on the first surface, a pair of fifth test pads TPAD5 and TPAD5', which correspond respectively to the pair of fourth test pads TPAD4 and TPAD4', and may include, on the second surface, a pair of sixth test pads TPAD6 and TPAD6'. The fifth test pad TPAD5 and the sixth test pad TPAD6 may be coupled to each other by a through via V6, which traverses the third wafer W3 in the vertical direction. The fifth test pad TPAD5' and the sixth test pad TPAD6' may be coupled to each other with a through via V6', which traverses the third wafer W3 in the vertical direction.

The fourth test pads TPAD4 and TPAD4', the interconnect structure IS, the fifth test pads TPAD5 and TPAD5', the sixth test pads TPAD6 and TPAD6' and the through vias V6 and V6' may constitute a second test pattern TS2 for detecting a pad misalignment failure between the first wafer W1 and the third wafer W3.

During manufacturing, the fourth test pads TPAD4 and TPAD4' may be formed at the same process step as the fourth bonding pad PAD4. Accordingly, the fourth test pads TPAD4 and TPAD4' may be formed of the same material as the fourth bonding pad PAD4. The fifth test pads TPAD5 and TPAD5' may be formed at the same process step as the fifth bonding pad PAD5, and may be formed of the same material as the fifth bonding pad PAD5. The sixth test pads TPAD6 and TPAD6' may be formed at the same process step as the sixth bonding pad PAD6, and may be formed of the same material as the sixth bonding pad PAD6. The through vias V6 and V6' may be formed at the same process step as the through via V5, and may be formed of the same material as the through via V5.

The third wafer W3 may be stacked on the other surface of the first wafer W1 such that the fifth bonding pad PAD5 is coupled to the fourth bonding pad PAD4. If a pad misalignment failure does not occur when the third wafer W3 is stacked on the first wafer W1, then the fifth bonding pad PAD5 of the third wafer W3 will be coupled to the fourth bonding pad PAD4 of the first wafer W1. Further, the fifth test pad TPAD5 of the third wafer W3 will be coupled to the fourth test pad TPAD4 of the first wafer W1, and the fifth test pad TPAD5' of the third wafer W3 will be coupled to the fourth test pad TPAD4' of the first wafer W1.

Accordingly, an electrical path may be configured that couples elements constituting the second test pattern TS2, that is, the sixth test pad TPAD6, the through via V6 and the fifth test pad TPAD5 of the third wafer W3; the fourth test pad TPAD4, the interconnect structure IS and the fourth test pad TPAD4' of the first wafer W1; and the fifth test pad TPAD5', the through via V6' and the sixth test pad TPAD6' of the third wafer W3.

Figure 8:
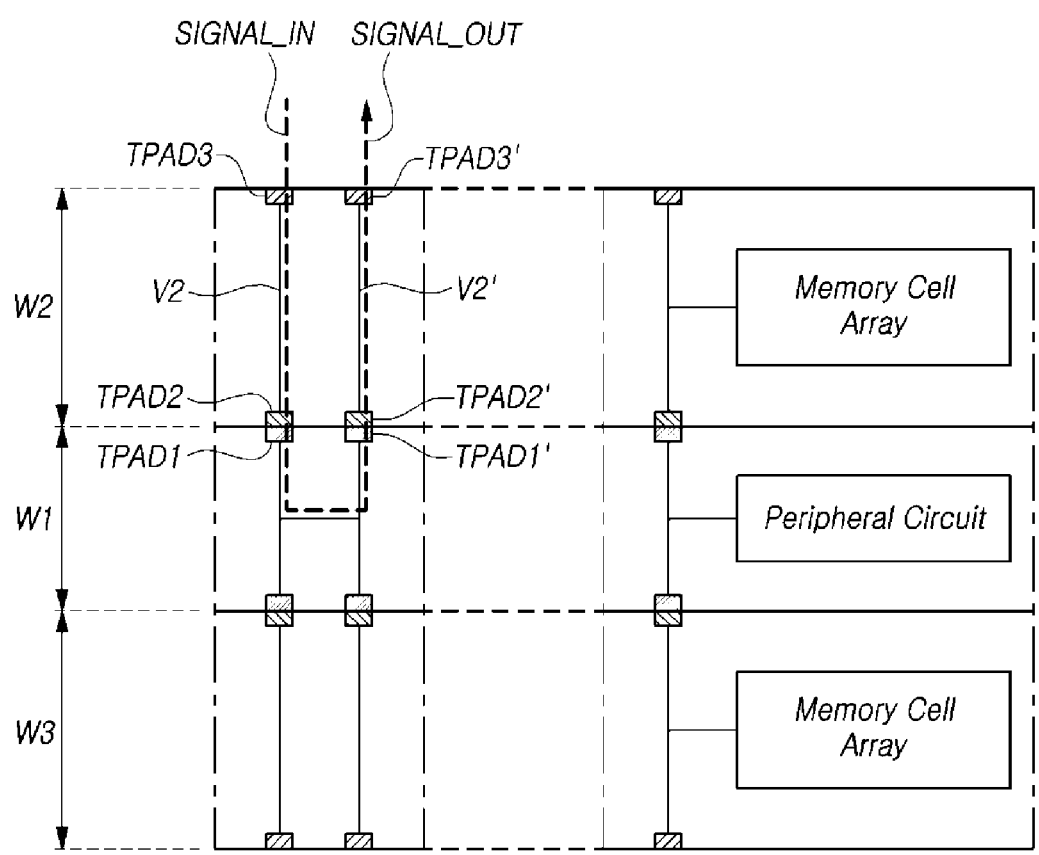
FIG. 8 is a diagram illustrating the flow of a test signal in a memory device of FIG. 7 when a pad misalignment failure is tested between a first wafer and a second wafer.
Figure 9:
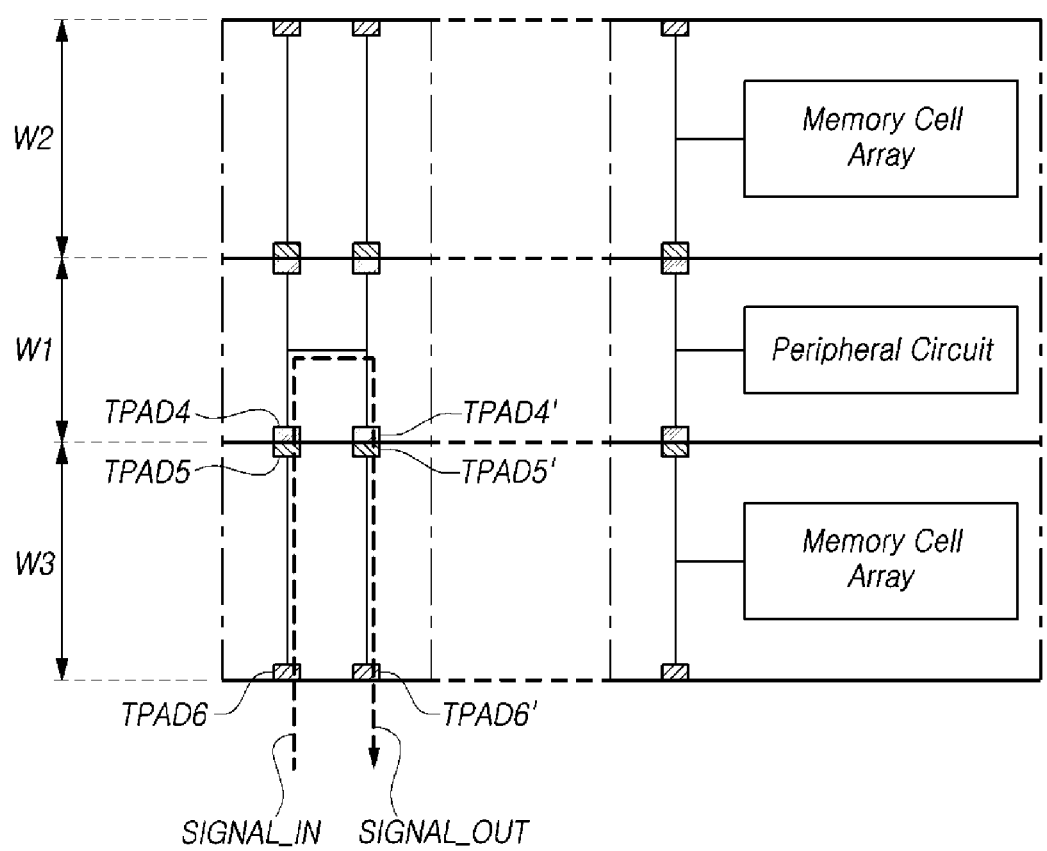
FIG. 9 is a diagram illustrating the flow of a test signal in a memory device of FIG. 7 when a pad misalignment failure is tested between the first wafer and a third wafer.

FIG. 8 is a diagram illustrating the flow of a test signal in a memory device of FIG. 7 when a pad misalignment failure is tested between the first wafer and the second wafer. FIG. 9 is a diagram illustrating the flow of a test signal in a memory device of FIG. 7 when a pad misalignment failure is tested between the first wafer and the third wafer.

Referring to FIG. 8, when testing for a pad misalignment failure between the first wafer W1 and the second wafer W2, the test signal SIGNAL_IN may be applied to the third test pad TPAD3 of the second wafer W2. If a pad misalignment failure does not occur, then the second test pad TPAD2 of the second wafer W2 and the first test pad TPAD1 of the first wafer W1 may be coupled to each other. In addition, the second test pad TPAD2' of the second wafer W2 and the first test pad TPAD1' of the first wafer W1 may be coupled to each other, thereby configuring an electrical path that couples the third test pad TPAD3 and the third test pad TPAD3' to each other. Accordingly, the test signal SIGNAL_IN applied to the third test pad TPAD3 may be transferred to the third test pad TPAD3' via the electrical path, and thus, the signal SIGNAL_OUT will be detected from the third test pad TPAD3'.

Referring to FIG. 9, when testing for a pad misalignment failure between the first wafer W1 and the third wafer W3, the test signal SIGNAL_IN may be applied to the sixth test pad TPAD6 of the third wafer W3. If a pad misalignment failure does not occur, then the fifth test pad TPAD5 of the third wafer W3 and the fourth test pad TPAD4 of the first wafer W1 may be coupled to each other. In addition, the fifth test pad TPAD5' of the third wafer W3 and the fourth test pad TPAD4' of the first wafer W1 may be coupled to each other, thereby configuring an electrical path that couples the sixth test pad TPAD6 and the sixth test pad TPAD6' to each other. Accordingly, the test signal SIGNAL_IN applied to the sixth test pad TPAD6 may be transferred to the sixth test pad TPAD6' via the electrical path, and thus, the signal SIGNAL_OUT will be detected from the sixth test pad TPAD6'.

Figure 10:
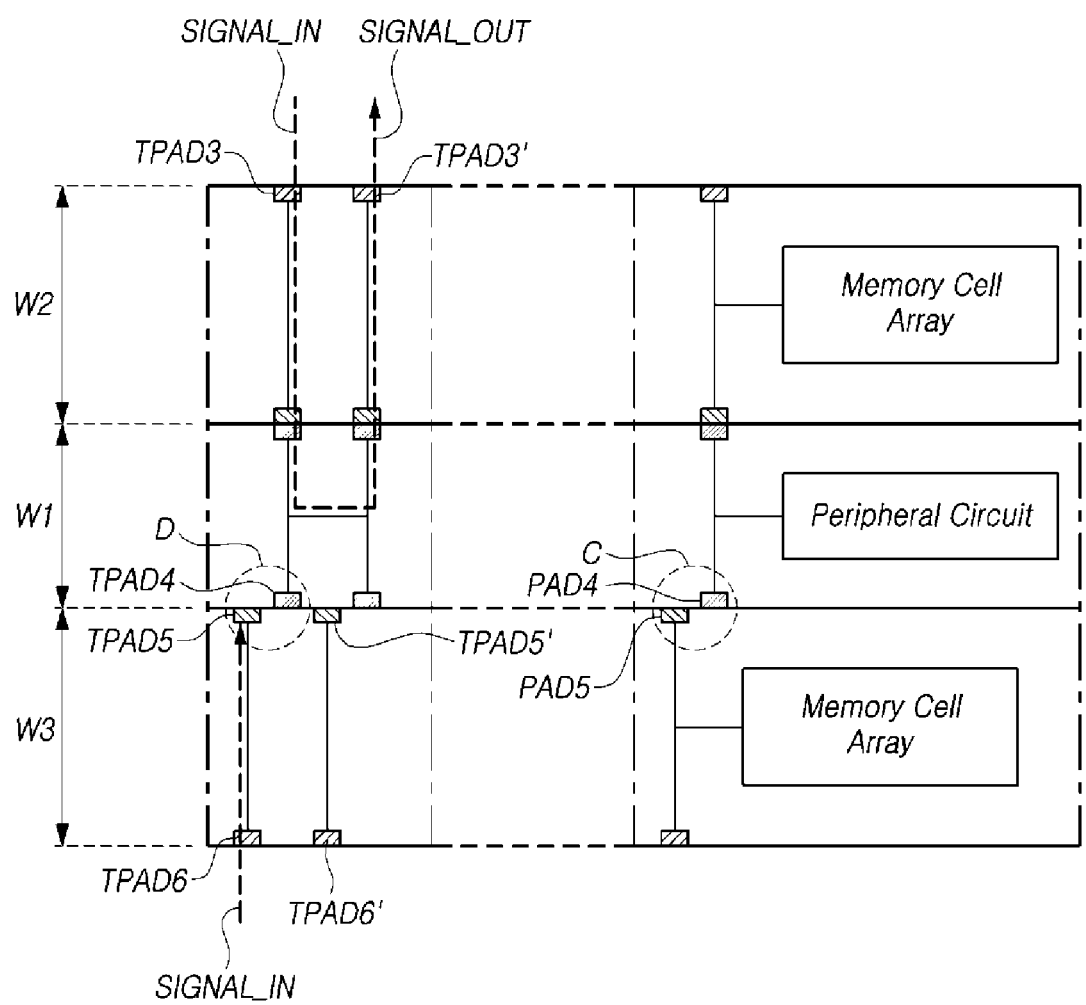
FIG. 10 is a diagram illustrating the flow of a test signal in a memory device of FIG. 7 when a pad misalignment failure occurs between the first wafer and the third wafer but no pad misalignment failure occurs between the first wafer and the second wafer.

FIG. 10 is a diagram illustrating the flow of a test signal when a pad misalignment failure occurs between the first wafer and the third wafer but no pad misalignment failure occurs between the first wafer and the second wafer.

Referring to FIG. 10, if a pad misalignment failure does not occur with the second wafer W2 stacked on the one surface of the first wafer W1, as described above with reference to FIG. 8, then a test signal SIGNAL_IN applied to the third test pad TPAD3 results in a signal SIGNAL_OUT detected from the third test pad TPAD3'.

On the other hand, if a pad misalignment failure occurs with the third wafer W3 stacked on the other surface of the first wafer W1, then the fifth bonding pad PAD5 of the third wafer W3 and the fourth bonding pad PAD4 of the first wafer W1 may not be coupled to each other (see part C). In this case, as illustrated in part D, the fifth test pad TPAD5 of the third wafer W3 will not be coupled to the fourth test pad TPAD4 of the first wafer W1, and the fifth test pad TPAD5' of the third wafer W3 will not be coupled to the fourth test pad TPAD4' of the first wafer W1. Therefore, the test signal SIGNAL_IN applied to the sixth test pad TPAD6 of the third wafer W3 is not transferred to the sixth test pad TPAD6' of the third wafer W3, and no signal will be detected from the sixth test pad TPAD6' of the third wafer W3.

According to embodiments contemplated by the disclosure, proposed structures of memory devices make it possible to identify where a pad misalignment failure has occurred as between the second wafer W2 and the third wafer W3. Therefore, if a pad misalignment failure occurs in only one of either the second wafer W2 or the third wafer W3, instead of handling both the second wafer W2 and the third wafer W3 as bad products, only one of the two wafers needs to be processed as a bad product, and the other wafer in which a pad misalignment failure has not occurred may still be used as a memory device with a reduced memory capacity, thereby contributing to improvement in the manufacturing yield. Thus, methods of detecting pad misalignment failures in devices of embodiments of the disclosure and mitigating the results of such failures are also described above with reference to FIGS. 1 to 4 and contemplated by the disclosure.

Figure 11:
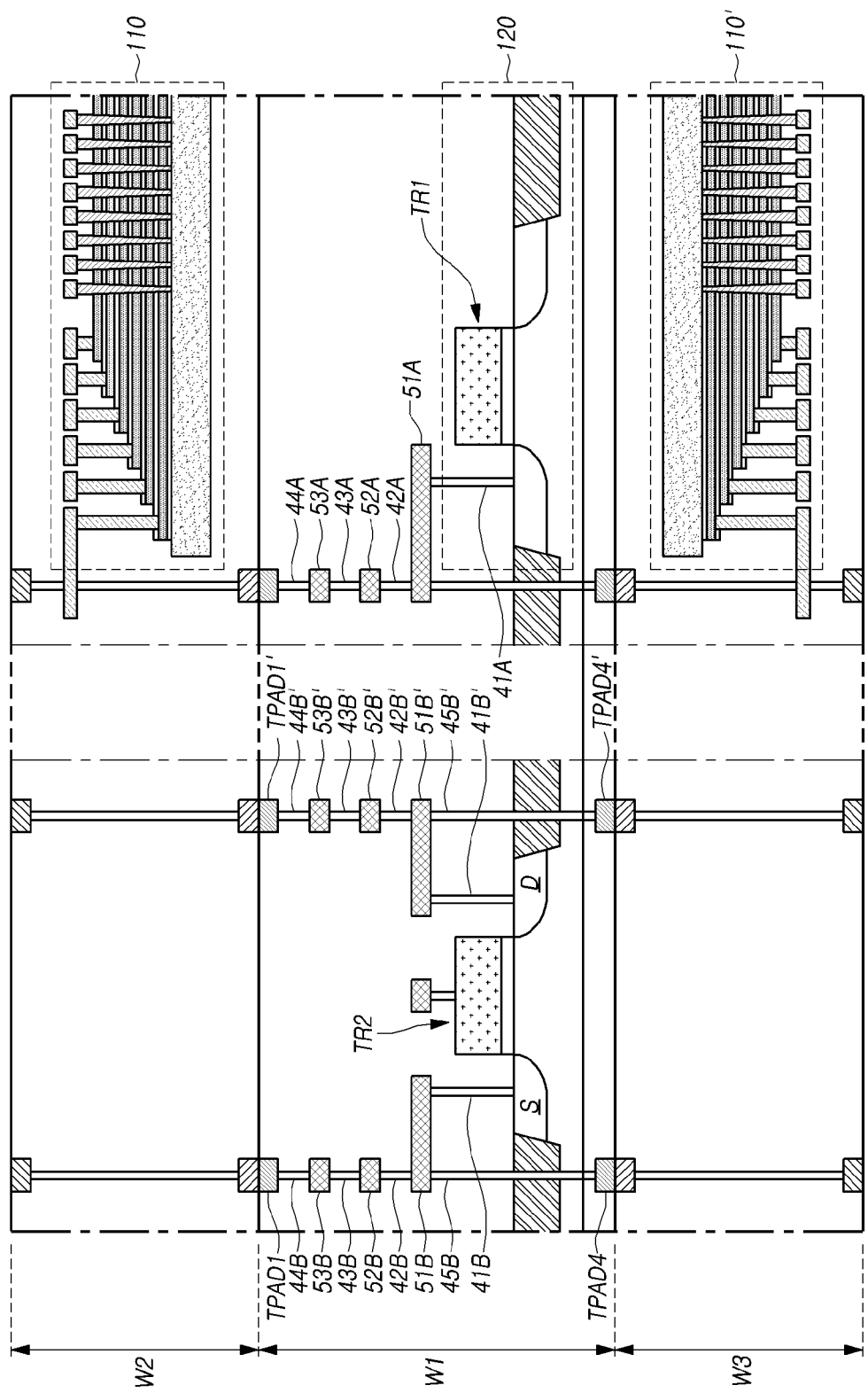
FIG. 11 is a cross-sectional view illustrating detail of a memory device illustrated in FIG. 7.

FIG. 11 is a cross-sectional view illustrating details of a memory device illustrated in FIG. 7.

Referring to FIG. 11, the first test pad TPAD1 and the first test pad TPAD1' may be coupled through a switching transistor TR2 in a first wafer W1. The switching transistor TR2 may be fabricated by utilizing a manufacturing process, which may be the same process, used to fabricate a transistor TR1, which constitutes the peripheral circuit 120. The first test pad TPAD1 may be coupled to a source region S of the switching transistor TR2 through contacts 41B to 44B and wiring lines 51B to 53B, and the first test pad TPAD1' may be coupled to a drain region D of the switching transistor TR2 through contacts 41B' to 44B' and wiring lines 51B' to 53B'. The switching transistor TR2 may constitute an interconnect structure IS (see FIG. 7) that couples the first test pad TPAD1 and the first test pad TPAD1'.

The fourth test pad TPAD4 and the fourth test pad TPAD4' may be coupled through the switching transistor TR2. The fourth test pad TPAD4 may be coupled to the source region S of the switching transistor TR2 through contacts 41B and 45B and the wiring line 51B, and the fourth test pad TPAD4' may be coupled to the drain region D of the switching transistor TR2 through contacts 41B' and 45B' and the wiring line 51B'. The switching transistor TR2 may constitute the interconnect structure IS (see FIG. 7) that couples the fourth test pad TPAD4 and the fourth test pad TPAD4'.

Figure 12:
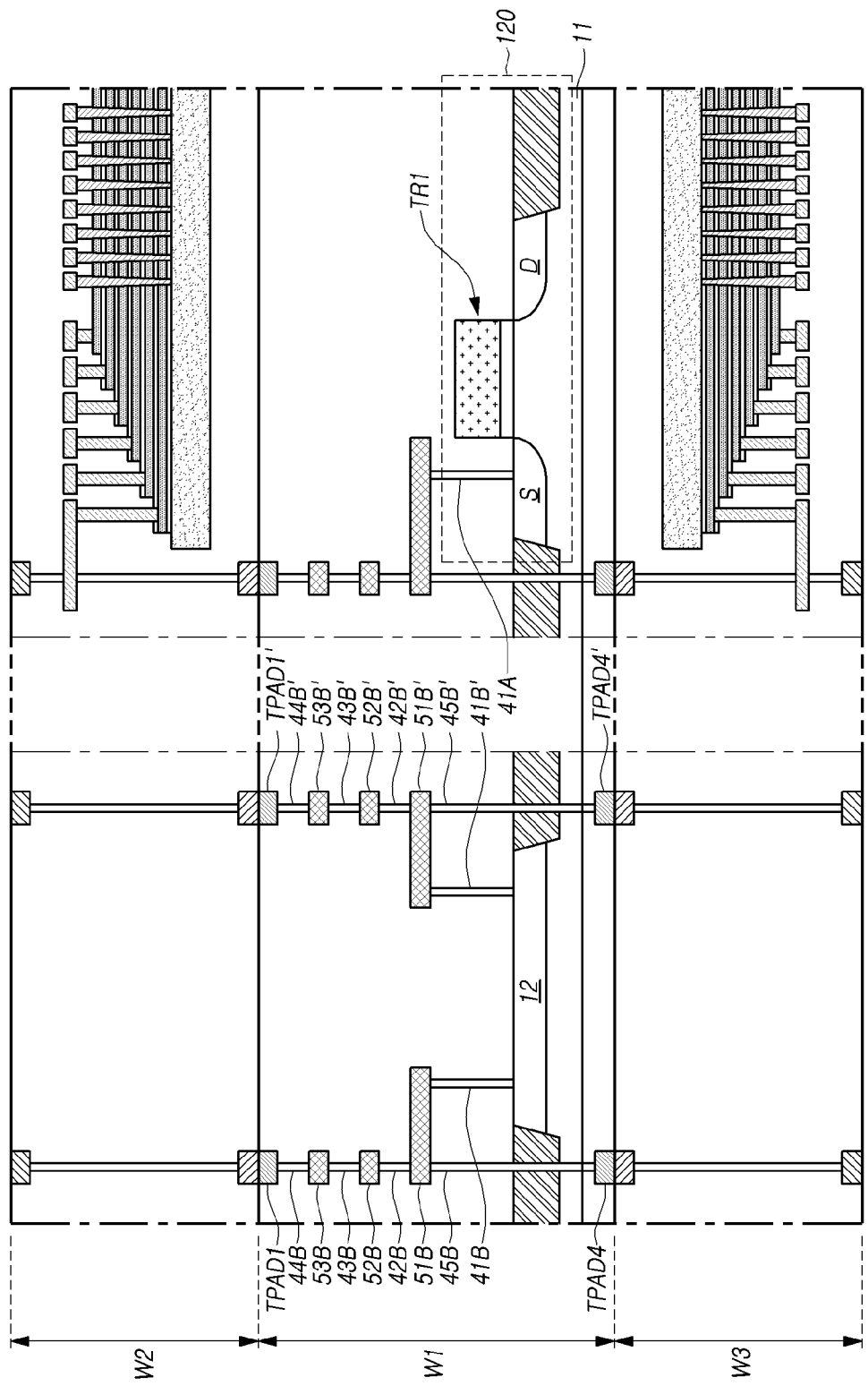
FIGS. 12 and 13 are cross-sectional views illustrating examples of interconnect structures.
Figure 13:
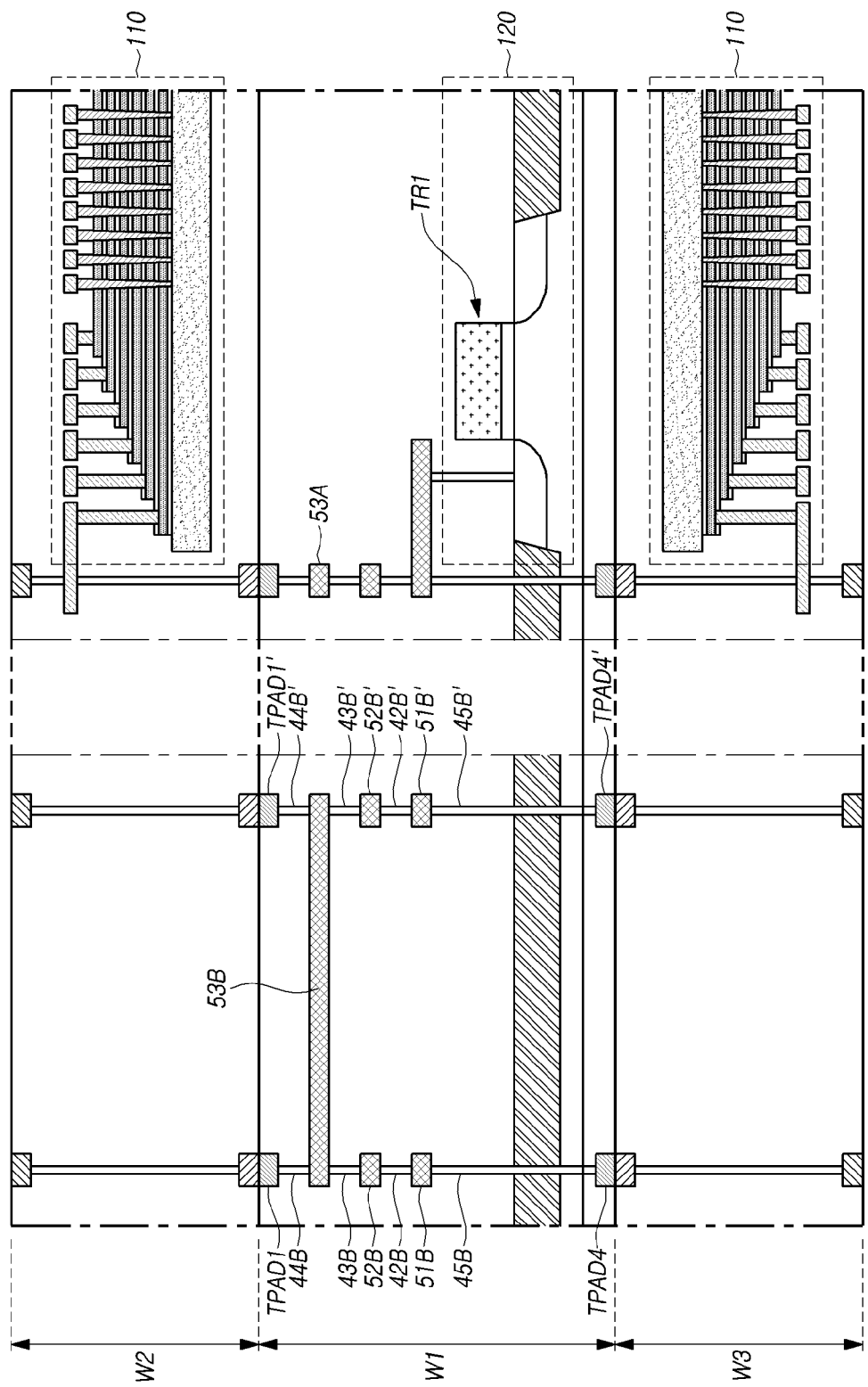

FIGS. 12 and 13 are cross-sectional views illustrating examples of interconnect structures.

Referring to FIG. 12, the first test pad TPAD1 and the first test pad TPAD1' may be coupled to each other through a semiconductor layer 12, which is defined in the substrate 11. The semiconductor layer 12 may be fabricated by utilizing an impurity implantation process for forming a source region S and a drain region D of the transistor TR1, which constitutes the peripheral circuit 120. The first test pad TPAD1 may be coupled to one end of the semiconductor layer 12 through contacts 41B to 44B and wiring lines 51B to 53B, and the first test pad TPAD1' may be coupled to the other end of the semiconductor layer 12 through contacts 41B' to 44B' and wiring lines 51B' to 53B'. The semiconductor layer 12 may constitute the interconnect structure IS (see FIG. 7) that couples the first test pad TPAD1 and the first test pad TPAD1'.

The fourth test pad TPAD4 and the fourth test pad TPAD4' may be coupled to each other through the semiconductor layer 12. The fourth test pad TPAD4 may be coupled to the one end of the semiconductor layer 12 through the contacts 41B and 45B and the wiring line 51B, and the fourth test pad TPAD4' may be coupled to the other end of the semiconductor layer 12 through the contacts 41B' and 45B' and the wiring line 51B'. The semiconductor layer 12 may constitute the interconnect structure IS (see FIG. 7) that couples the fourth test pad TPAD4 and the fourth test pad TPAD4'.

Referring to FIG. 13, the first test pad TPAD1 and the first test pad TPAD1' may be coupled to each other through a wiring line 53B. The wiring line 53B may be fabricated by utilizing a manufacturing process, which may be the same process, used to fabricate wiring line 53A, which is used in coupling the peripheral circuit 120 and the first bonding pad PAD1. The first test pad TPAD1 may be coupled to one end of the wiring line 53B through a contact 44B, and the first test pad TPAD1' may be coupled to the other end of the wiring line 53B through a contact 44B'. In contrast to FIGS. 11 and 12, here the wiring line 53B may constitute the interconnect structure IS (see FIG. 7), which is couples the first test pad TPAD1 and the first test pad TPAD1'.

The fourth test pad TPAD4 and the fourth test pad TPAD4' may be coupled to each other through the wiring line 53B. The fourth test pad TPAD4 may be coupled to the one end of the wiring line 53B through contacts 42B, 43B and 45B and wiring lines 51B and 52B, and the fourth test pad TPAD4' may be coupled to the other end of the wiring line 53B through contacts 42B', 43B' and 45B' and wire lines 51B' and 52B'. Thus, the wiring line 53B may also constitute the interconnect structure IS (see FIG. 7) that couples the fourth test pad TPAD4 and the fourth test pad TPAD4'.

Figure 14:
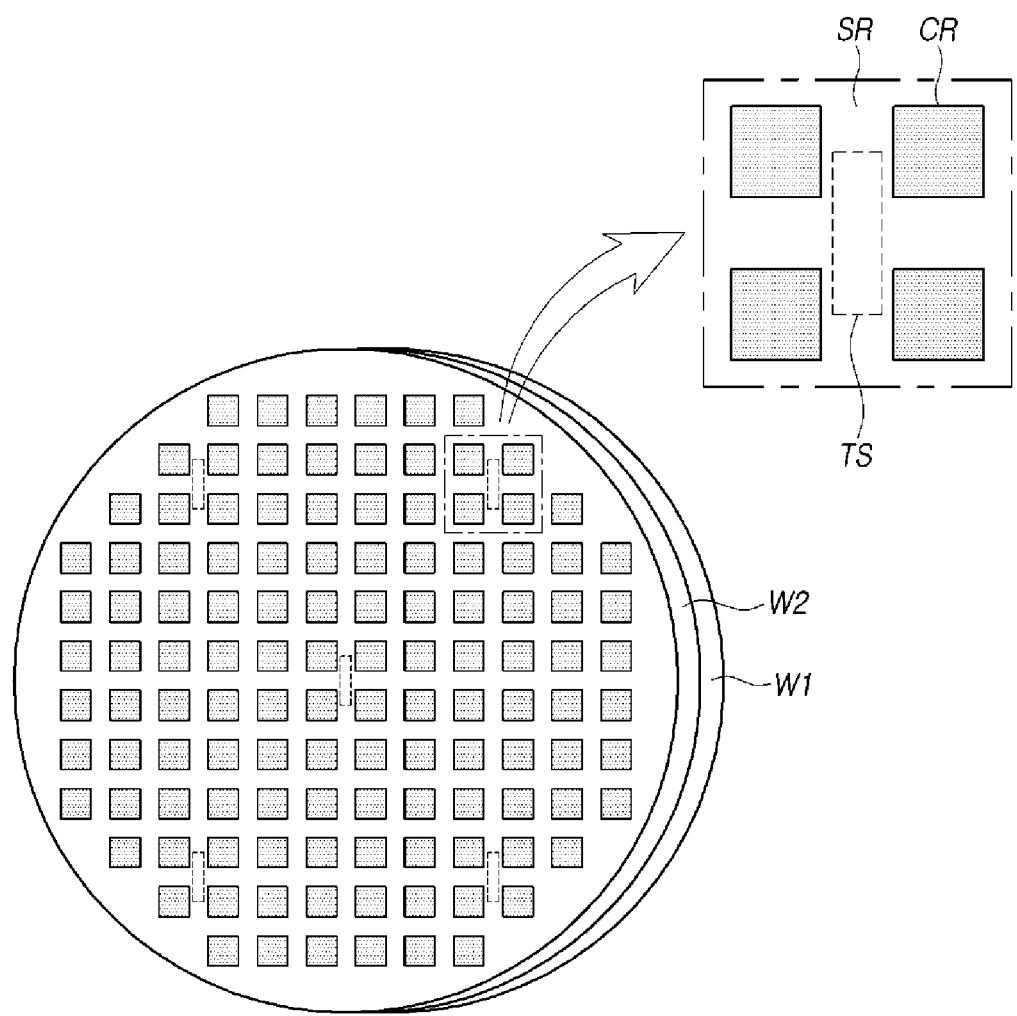
FIG. 14 is a top view illustrating a position of a test pattern in a memory device in accordance with an embodiment of the disclosure.

FIG. 14 is a top view illustrating a position of a test pattern in a memory device in accordance with an embodiment of the disclosure.

Referring to FIG. 14, in a top or plan view, along the vertical direction, a memory device in accordance with the embodiment of the disclosure may include a plurality of chip regions CR and a scribe lane region SR. The chip regions CR may be arranged two-dimensionally on a plane perpendicular to the vertical direction, which is the stacking direction of first and second wafers W1 and W2. A scribe lane region SR may be disposed between chip regions CR such that each of the chip regions CR may be surrounded by the scribe lane region SR. A peripheral circuit (e.g., 120 of FIG. 1) may be defined in each of the chip regions CR of the first wafer W1, and a memory cell array (e.g., 110 of FIG. 1) may be defined in each of the chip regions CR of the second wafer W2. The first and second wafers W1 and W2 may be cut along the scribe lane region SR when stacked, and accordingly, the memory device in embodiments herein may be individualized at a chip level.

A test pattern TS may be disposed in the scribe lane region SR. The test pattern TS may be the first test pattern TS1 of FIG. 1 or the first and second test patterns TS1 and TS2 of FIG. 7. Because the test pattern TS is disposed in the scribe lane region SR, it is possible to test for a pad misalignment failure between the wafers W1 and W2 without increasing the area of the chip region CR.

While FIG. 14 illustrates a wafer stack scheme, in which wafers are stacked and then are cut to a chip level, it is to be noted that the disclosure is not limited thereto. Other embodiments contemplated by the disclosure may implement a chip stack scheme in which separate wafers are cut into individualized chip units and then the individualized chip units are stacked.

Figure 15:
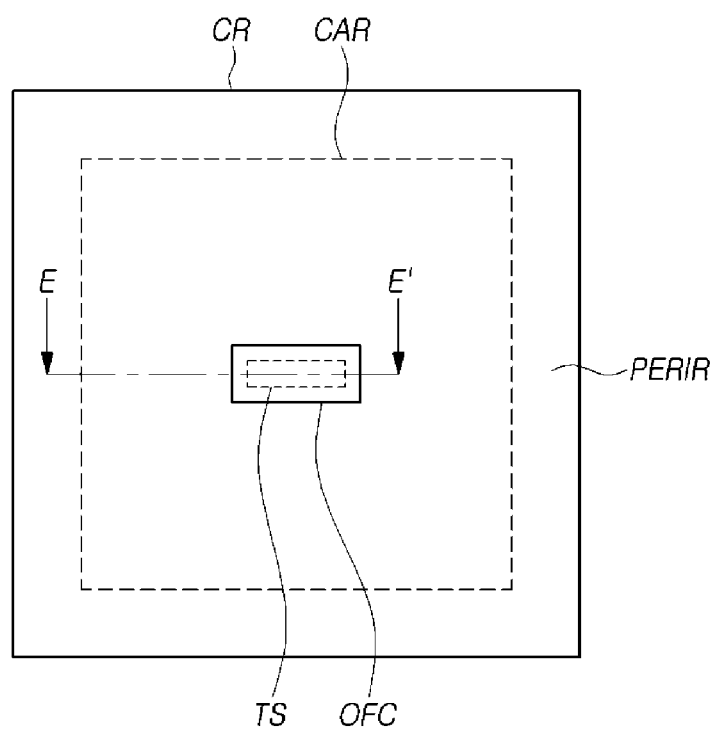
FIG. 15 is a top view illustrating another position of a test pattern in a memory device in accordance with an embodiment of the disclosure.
Figure 16:
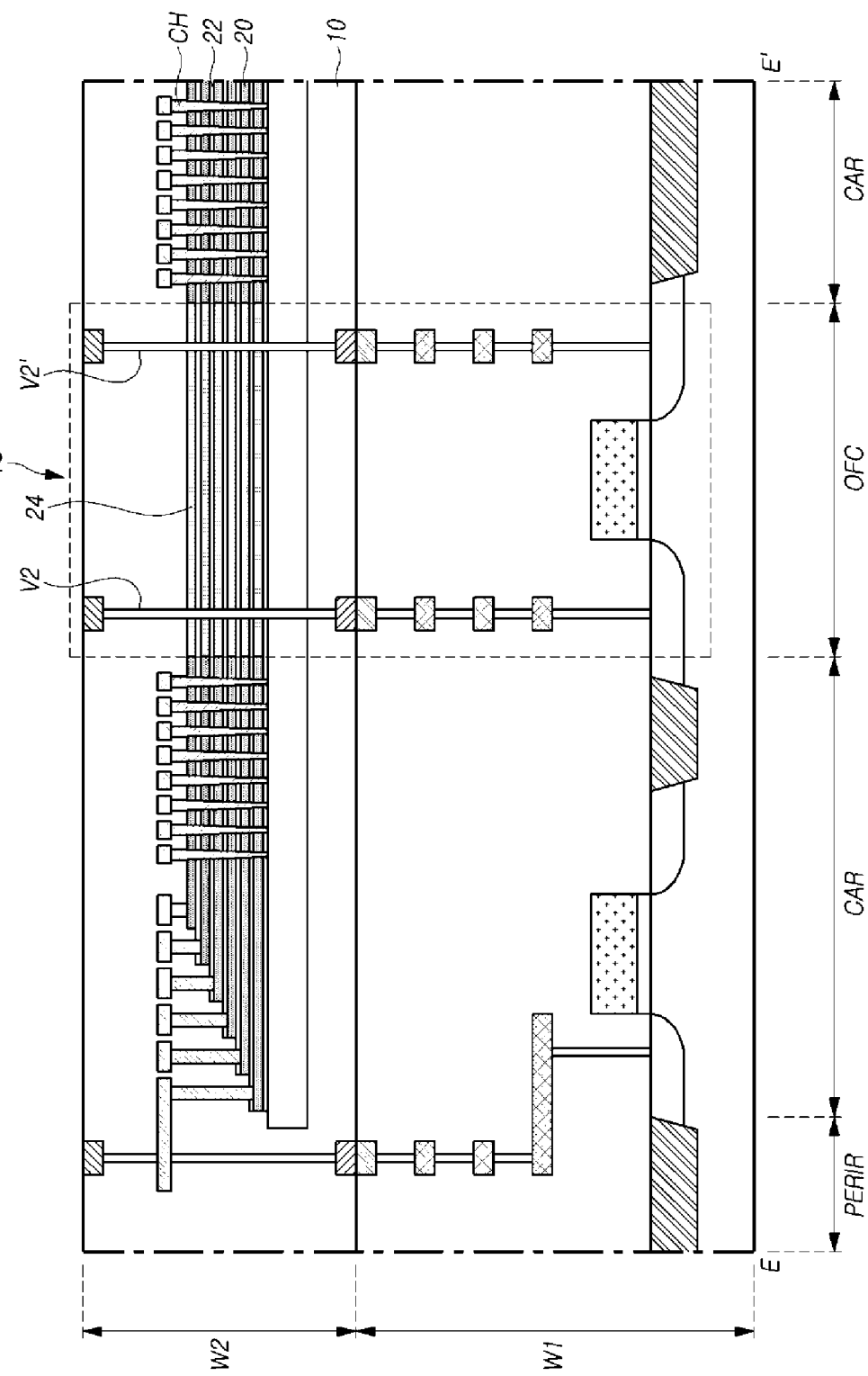
FIG. 16 is a cross-sectional view taken along the line E-E' of FIG. 15.
Figure 17:
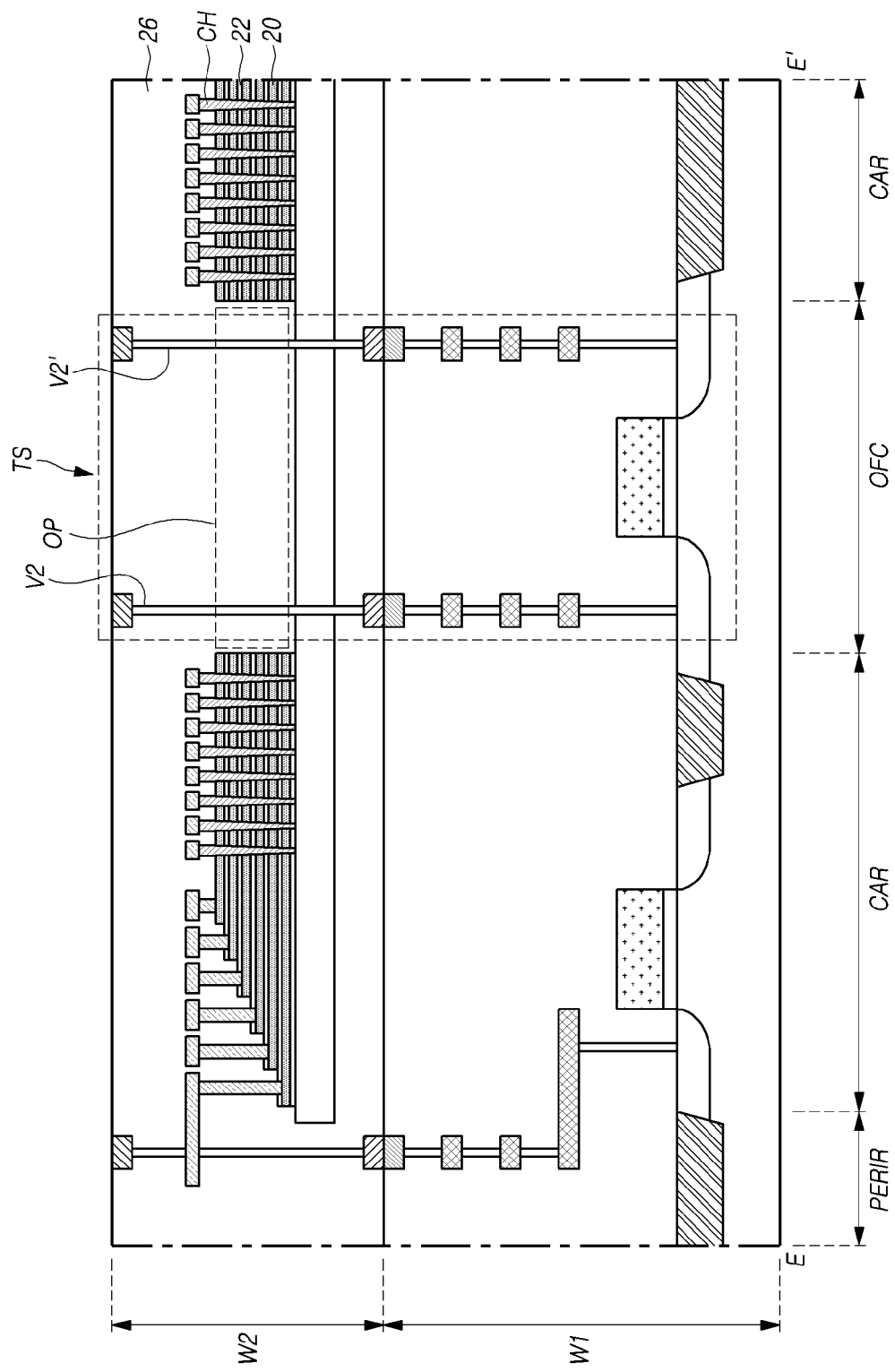
FIG. 17 is another cross-sectional view taken along the line E-E' of FIG. 15.

FIG. 15 is a top view illustrating another position of a test pattern in a memory device in accordance with an embodiment of the disclosure. FIG. 16 is a cross-sectional view taken along the line E-E' of FIG. 15, and FIG. 17 is another cross-sectional view taken along the line E-E' of FIG. 15.

Referring to FIG. 15, a chip region CR may include a cell region CAR, a peripheral region PERIR, and a coupling region OFC. The peripheral region PERIR may be disposed outside the cell region CAR. The cell region CAR may be surrounded by the peripheral region PERIR. The coupling region OFC may be surrounded by the cell region CAR. A test pattern TS may be disposed in the coupling region OFC.

Referring to FIG. 16, in the cell region CAR, a plurality of electrode layers 20 and a plurality of interlayer dielectric layers 22 may be alternately stacked on a source plate 10 of a second wafer W2. A plurality of vertical channels CH may be defined which pass through the plurality of electrode layers 20 and the plurality of interlayer dielectric layers 22. Memory cells may be disposed at portions or regions where the vertical channels CH intersect with the electrode layers 20. The cell region CAR may correspond to a region in which the plurality of electrode layers 20 and the plurality of interlayer dielectric layers 22 are alternately stacked.

A plurality of dielectric layers 24 and the plurality of interlayer dielectric layers 22 may be alternately stacked on the source plate 10 in the coupling region OFC. The plurality of dielectric layers 24 may be disposed at the same layer positions as the plurality of electrode layers 20, respectively. The dielectric layers 24 may be used as sacrificial layers, and may be formed of a dielectric material that has an etching selectivity with respect to the interlayer dielectric layers 22. For example, the interlayer dielectric layers 22 may be formed of silicon oxide, and the dielectric layers 24 may be formed of silicon nitride. The interlayer dielectric layers 22 may be continuous across the cell region CAR and the coupling region OFC.

The plurality of electrode layers 20 may not be formed in the coupling region OFC. The coupling region OFC may correspond to a region where the plurality of dielectric layers 24 and the plurality of interlayer dielectric layers 22 are alternately stacked. Through vias V2 and V2', which are part of a test pattern TS, may pass vertically through the plurality of dielectric layers 24 and the plurality of interlayer dielectric layers 22.

Referring to FIG. 17, an opening OP may be defined, in coupling region OFC, that passes vertically through the plurality of electrode layers 20 and the plurality of interlayer dielectric layers 22. The coupling region OFC may correspond to a region in which the opening OP is positioned. The opening OP may be filled with a dielectric layer 26. Through vias V2 and V2', which are part of the test pattern TS, may pass vertically through the dielectric layer 26, which fills the opening OP.

Figure 18:
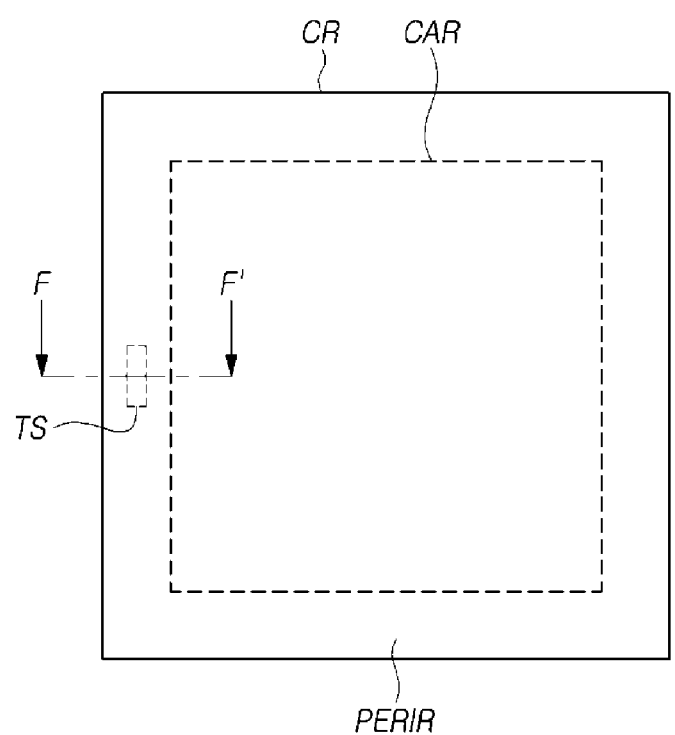
FIG. 18 is a top view illustrating still another position of a test pattern in a memory device in accordance with an embodiment of the disclosure.
Figure 19:
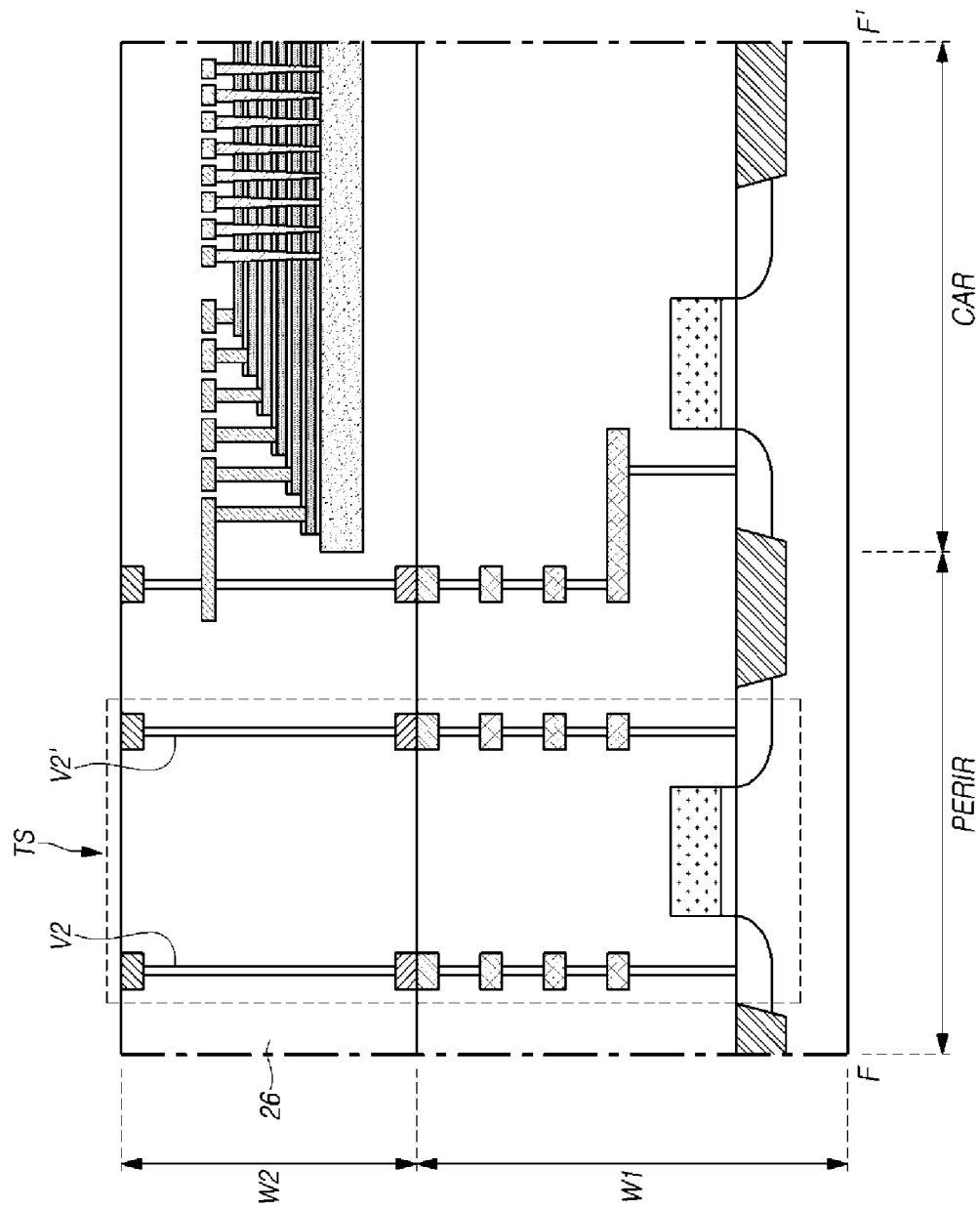
FIG. 19 is a cross-sectional view taken along the line F-F' of FIG. 18.

FIG. 18 is a top view illustrating still another position of a test pattern in a memory device in accordance with an embodiment of the disclosure, and FIG. 19 is a cross-sectional view taken along the line F-F' of FIG. 18.

Referring to FIGS. 18 and 19, a test pattern TS may be disposed in a peripheral region PERIR. Through vias V2 and V2', which are part of a test pattern TS, may pass through a dielectric layer 26 of the peripheral region PERIR.

Figure 20:
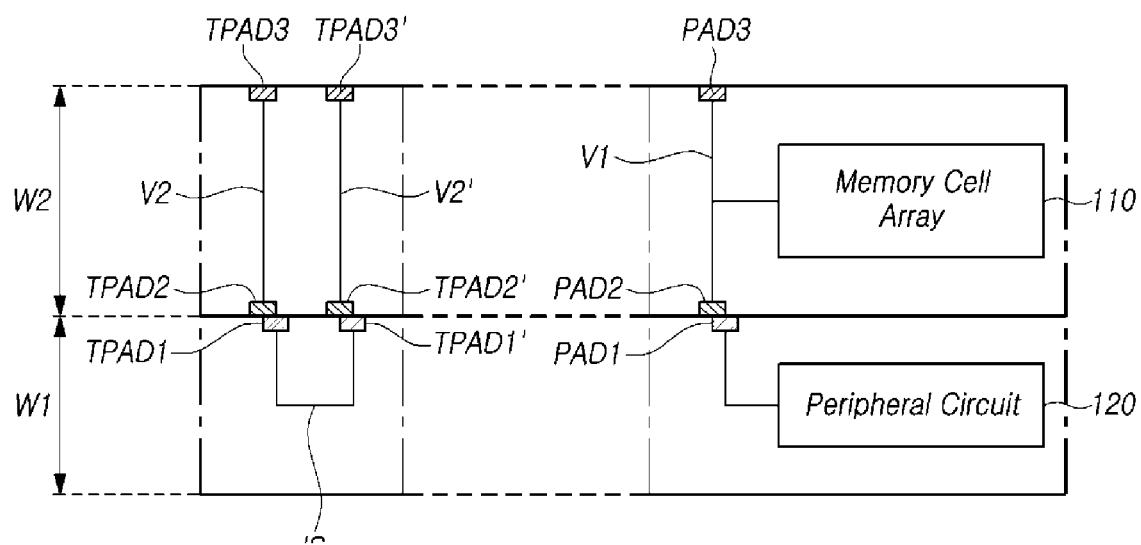
FIG. 20 is a diagram illustrating a memory device of FIG. 1 with a partial pad misalignment.

FIG. 20 is a diagram illustrating a memory device of FIG. 1 in with a partial pad misalignment.

Referring to FIG. 20, when the second wafer W2 is stacked on the first wafer W1, the first bonding pad PAD1 and the second bonding pad PAD2 may be bonded to each other in a partially misaligned state. In this case, although the first bonding pad PAD1 and the second bonding pad PAD2 are coupled to each other, the overlap area between the first bonding pad PAD1 and the second bonding pad PAD2 is reduced. Thus, the contact resistance between the first bonding pad PAD1 and the second bonding pad PAD2 will have a larger value compared to devices with wafers that are not misaligned. During an operation of the memory device, an operating voltage from the first wafer W1 may be provided to the second wafer W2 via the bonded area between the first bonding pad PAD1 and the second bonding pad PAD2. If the first bonding pad PAD1 and the second bonding pad PAD2 are bonded to each other but partially misaligned, then a significant voltage drop may occur in the first bonding pad PAD1 and the second bonding pad PAD2 due to contact resistance, and thus, a voltage having a level lower than a desired level may be provided to the second wafer W2.

For example, in a program operation, a program voltage from the first wafer W1 may be provided to a word line of the second wafer W2 via the bonding portion between the first bonding pad PAD1 and the second bonding pad PAD2. If the first bonding pad PAD1 and the second bonding pad PAD2 are, relative to each other, in a partially misaligned state, then the program voltage having a level lower than a desired level may be provided to the word line. Consequently, a rising level in the threshold voltage of a memory cell may be smaller, which results in a slow cell whose cell distribution characteristic is degraded. That is to say, a slow failure may occur.

In a program operation example, a power supply voltage from the first wafer W1 may be provided to a bit line of the second wafer W2 via the overlapping portion or surface area between the first bonding pad PAD1 and the second bonding pad PAD2. In a read operation example, a precharge voltage from the first wafer W1 may be provided to a bit line of the second wafer W2 via the bond between the first bonding pad PAD1 and the second bonding pad PAD2. If the first bonding pad PAD1 and the second bonding pad PAD2 are bonded to each other in a partially misaligned state, the power supply voltage and the precharge voltage having reduced levels that are lower than desired levels may be provided to the bit lines. Thus, due to bonding pad misalignment, failures in which the wrong data is programmed or read may occur.

Embodiments of the disclosure may suggest a memory device capable of compensating for a voltage drop at the bonding portion between the first bonding pad PAD1 and the second bonding pad PAD2 in the case where the first bonding pad PAD1 and the second bonding pad PAD2 are bonded to each other, but in the partially misaligned state, and methods of operating such devices.

Figure 21:
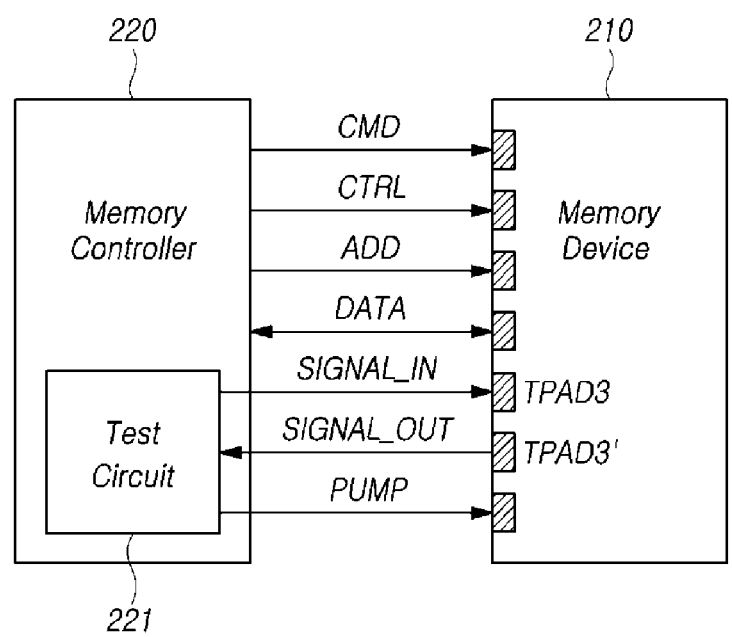
FIG. 21 is a block diagram illustrating a memory system in accordance with an embodiment of the disclosure.
Figure 22:
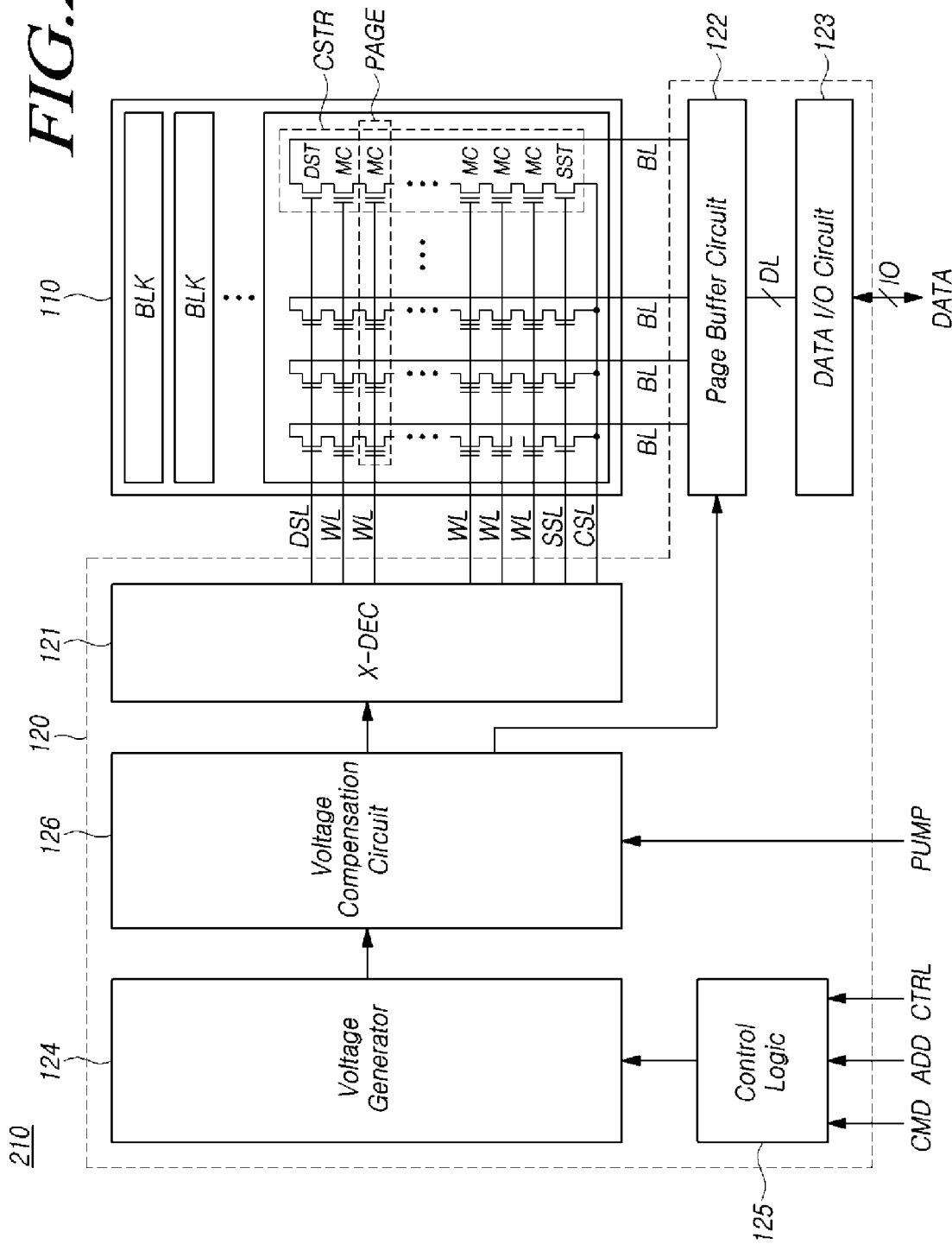
FIG. 22 is a block diagram illustrating a memory device illustrated in FIG. 21.

FIG. 21 is a block diagram illustrating a memory system in accordance with an embodiment of the disclosure. FIG. 22 is a block diagram illustrating a memory device illustrated in FIG. 21.

Referring to FIG. 21, a memory system may include a memory device 210 and a memory controller 220. By the combination of the memory device 210 and the memory controller 220, a memory card or a solid state disk (SSD) may be provided.

The memory device 210 may perform a write, read or erase operation under the control of the memory controller 220. To this end, the memory device 210 may receive a command CMD, an address ADD, a control signal CTRL and data DATA from the memory controller 220.

The memory controller 220 may include a test circuit 221 which is associated with third test pads TPAD3 and TPAD3'. The test circuit 221 may apply a test signal SIGNAL_IN to the third test pad TPAD3 of the memory device 210, and may detect a signal SIGNAL_OUT outputted from the third test pad TPAD3'. The test circuit 221 may calculate a ratio between the magnitudes of the test signal SIGNAL_IN and the output signal SIGNAL_OUT, that is, an input-to-output ratio, and may provide a power-up signal PUMP to the memory device 210 based on the calculated input-to-output ratio. For example, as illustrated in FIG. 20, when the second wafer W2 including the memory cell array 110 is stacked on the first wafer W1 including the peripheral circuit 120, the first test pad TPAD1 and the second test pad TPAD2 may be bonded in a partially misaligned state and the first test pad TPAD1' and the second test pad TPAD2' may be bonded in a partially misaligned state. Thus, the input-to-output ratio between the test input signal and the output signal may have a value that is smaller than a reference value. In this case, the test circuit 221 may output the power-up signal PUMP to the memory device 210.

Referring to FIG. 22, the memory device 210 may include a memory cell array 110 and a peripheral circuit 120. The peripheral circuit 120 may include a row decoder 121, a page buffer circuit 122, a data input/output circuit 123, a voltage generator 124, a control logic 125, and a voltage compensation circuit 126. The memory cell array 110 and the peripheral circuit 120 may be disposed on different wafers. For example, the memory cell array 110 may be disposed in the second wafer W2 of FIG. 20, and the peripheral circuit 120 may be disposed in the first wafer W1 of FIG. 20.

The memory cell array 110 may include a plurality of memory blocks BLK. Each of the memory blocks BLK may include a plurality of cell strings CSTR. Each of the cell strings CSTR may be coupled between a corresponding bit line BL and a common source line CSL. Each of the cell strings CSTR may include a source select transistor SST which is coupled to the common source line CSL, a drain select transistor DST that is coupled to a bit line BL, and a plurality of memory cells MC that are coupled in series between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed or arranged in a direction perpendicular to the bit line BL. The source select line SSL, the word lines WL and the drain select line DSL may form a three-dimensional structure when stacked on the surface of a substrate in a vertical direction.

Memory cells MC included in the memory block BLK may be divided into physical page units or logical page units. For example, memory cells MC that share one word line WL and are coupled to different cell strings CSTR may configure one physical page PAGE. Such a page may be the basic unit of a read operation.

FIG. 22 illustrates that one drain select transistor DST and one source select transistor SST are provided in each of the cell strings CSTR. However, it is to be noted that at least two drain select transistors or at least two source select transistors may be provided in each of the cell strings CSTR in other embodiments contemplated by the disclosure.

The row decoder 121 may be coupled to the memory cell array 110 through the source select line SSL, the word lines WL and the drain select line DSL. In a program or read operation, the row decoder 121 may select any one from among the memory blocks BLK included in the memory cell array 110, based on the address ADD.

The page buffer circuit 122 may be coupled to the memory cell array 110 through bit lines BL. The page buffer circuit 122 may include a plurality of page buffers that are coupled to the bit lines BL.

The page buffer circuit 122 may temporarily store data to be programmed to a selected page, or temporarily store data read from a selected page.

The data input/output circuit 123 may be coupled to the page buffer circuit 122 through data lines DL, and may be coupled to the memory controller 220 through input/output lines IO. The data input/output circuit 123 may receive program data from the memory controller 220 in a program operation, and may provide data stored in the page buffer circuit 122 to the memory controller 220 in a read operation.

The voltage generator 124 may generate various voltages necessary for operations such as program, read and erase operations. The control logic 125 may control the operations of the memory device 210, such as program, read and erase operations, by using the command CMD, the address ADD and the control signal CTRL. For example, in a program operation, the control logic 125 may control the row decoder 121 to provide a program voltage to a selected word line, and may control the page buffer circuit 122 and the data input/output circuit 123 to store data in a selected page.

The voltage compensation circuit 126 may receive the power-up signal PUMP from the memory controller 220, may boost voltages provided from the voltage generator 124 in response to the power-up signal PUMP, and may provide the boosted voltages to the first bonding pad PAD1 (see FIG. 20) through the row decoder 121 and the page buffer circuit 122. Accordingly, in the case where the first bonding pad PAD1 (see FIG. 20) and the second bonding pad PAD2 (see FIG. 20) are bonded to each other in the partially misaligned state, it is possible to compensate for a voltage drop between the first bonding pad PAD1 and the second bonding pad PAD2.

As is apparent from the above descriptions, according to the embodiments of the disclosure, when a pad misalignment failure occurs, it is possible to detect the pad misalignment failure so as to prevent a memory device having the pad misalignment failure from being fabricated as a product, thereby improving the reliability of a product.

In addition, a pad misalignment failure may be easily detected by a simple task of applying a signal to a test pad and checking whether a signal is detected from another test pad, so it is possible to reduce time and effort required to detect pad misalignment failure. Moreover, expensive equipment, such as optical equipment, is not required to detect a pad misalignment failure, so it is possible to contribute to the reduction in manufacturing cost.

Further, it is possible to compensate for a voltage drop that occurs at the bonding portion between pads of stacked wafers if the pads are bonded to each other in a partially misaligned state, so it is possible to prevent a voltage provided to a cell wafer from a peripheral wafer from decreasing to a level lower than a desired level, and it is possible to prevent the operating characteristics of the memory device from being degraded, thereby contributing to an improvement in the reliability of the memory device.

Figure 23:
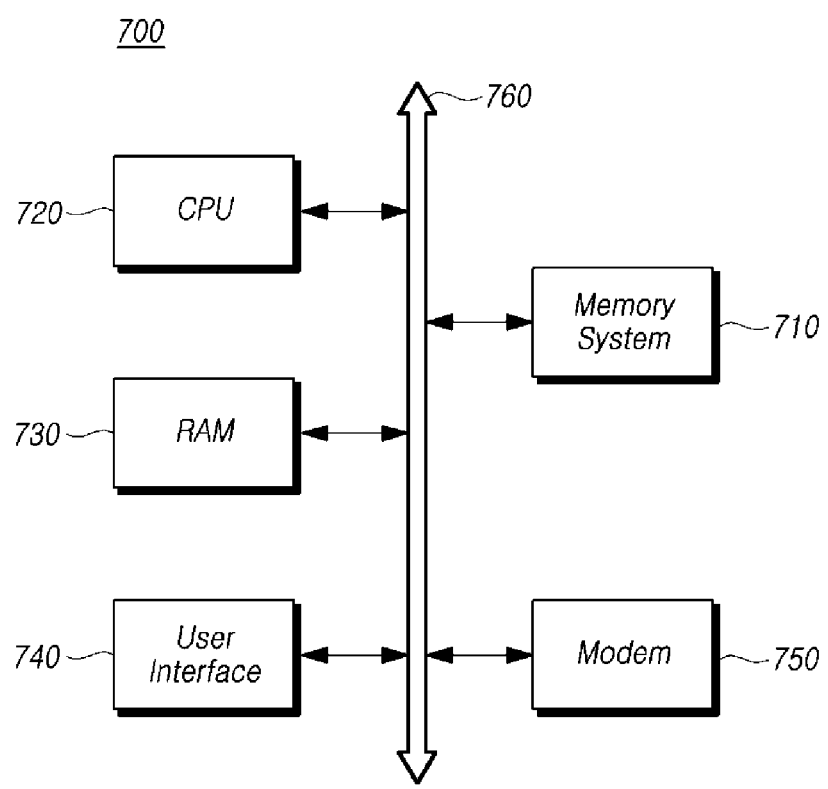
FIG. 23 is a block diagram schematically illustrating a computing system including a memory system in accordance with embodiments of the disclosure.

FIG. 23 is a block diagram schematically illustrating a computing system including a memory device in accordance with embodiments of the disclosure.

Referring to FIG. 23, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:
a first wafer including a first bonding pad disposed on a first surface;
a second wafer stacked on the first surface of the first wafer in a vertical direction that is perpendicular to the first surface of the first wafer, including a second bonding pad disposed on a second surface of the second wafer and corresponding to the first bonding pad, the second surface of the second wafer bonded on the first surface of the first wafer; and
a first test pattern, the first test pattern comprising:
a pair of first test pads disposed on the first surface of the first wafer and electrically coupled to each other;
a pair of second test pads disposed on the second surface of the second wafer and respectively coupled to the pair of first test pads, when no misalignment failure between the first bonding pad and the second bonding pad occurs; and
a pair of third test pads disposed on a third surface of the second wafer, which is opposite to the second surface in the vertical direction, and respectively coupled to the pair of second test pads.

2. The memory device according to claim 1, wherein each of the first wafer and the second wafer further comprises a plurality of chip regions and a scribe lane region between the chip regions, and
wherein a memory cell array is disposed in each of the plurality of chip regions of the second wafer, and a peripheral circuit for controlling an operation of the memory cell array is disposed in each of the plurality of chip regions of the first wafer.

3. The memory device according to claim 2, wherein the first wafer further includes an interconnect structure that couples the pair of first test pads.

4. The memory device according to claim 3, wherein the interconnect structure comprises a switching transistor defined in the first wafer.

5. The memory device according to claim 3, wherein the interconnect structure comprises a semiconductor layer that is also used to implement the peripheral circuit or a wiring layer.

6. The memory device according to claim 2, wherein the first test pattern is disposed in the scribe lane region.

7. The memory device according to claim 2,
wherein each of the plurality of chip regions includes a cell region and a coupling region,
wherein a plurality of interlayer dielectric layers and a plurality of electrode layers are alternately stacked and disposed in the cell region of the second wafer, and the plurality of interlayer dielectric layers and a plurality of dielectric layers are alternately stacked and disposed in the coupling region of the second wafer, and
wherein the first test pattern is disposed in the coupling region.

8. The memory device according to claim 2,
wherein each of the plurality of chip regions includes a cell region and a coupling region,
wherein a plurality of interlayer dielectric layers and a plurality of electrode layers are alternately stacked and disposed in the cell region of the second wafer, and a dielectric layer is disposed in the coupling region of the second wafer adjacent to the plurality of interlayer dielectric layers and the plurality of electrode layers alternately stacked and disposed in the cell region of the second wafer, and
wherein the first test pattern is disposed in the coupling region.

9. The memory device according to claim 2,
wherein each of the plurality of chip regions comprises:
a cell region in which a plurality of interlayer dielectric layers and a plurality of electrode layers are alternately stacked and disposed; and
a peripheral region outside the cell region, and
wherein the first test pattern is disposed in the peripheral region.

10. The memory device according to claim 1, further comprising:
- a fourth bonding pad defined on a fourth surface of the first wafer opposite to the first surface;
- a third wafer, including a fifth bonding pad disposed on a fifth surface of the third wafer and corresponding to the fourth bonding pad, and the fifth surface of the third wafer bonded on the fourth surface of the first wafer; and
- a second test pattern,
- the second test pattern comprising:
- a pair of fourth test pads, disposed on the fourth surface, and electrically coupled to each other;
- a pair of fifth test pads disposed on the fifth surface, and respectively coupled to the pair of fourth test pads, when no misalignment failure between the fourth bonding pad and the fifth bonding pad occurs; and
- a pair of sixth test pads disposed on a sixth surface of the third wafer, which is opposite to the fifth surface of the third wafer, and respectively coupled to the pair of fifth test pads.

11. The memory device according to claim 10, wherein each of the first wafer, second wafer and third wafer further comprises a plurality of chip regions and a scribe lane region between the chip regions, and
- wherein a memory cell array is disposed in each of the plurality of chip regions of the second and third wafers, and a peripheral circuit for controlling an operation of the memory cell array is disposed in each of the plurality of chip regions of the first wafer.

12. The memory device according to claim 11, wherein the first wafer further includes an interconnect structure that couples the pair of first test pads and that couples the pair of fourth test pads.

13. The memory device according to claim 12, wherein the interconnect structure comprises a switching transistor defined in the first wafer.

14. The memory device according to claim 12, wherein the interconnect structure comprises a semiconductor layer that is also used to implement the peripheral circuit or a wiring layer.

15. The memory device according to claim 11, wherein the first and second test patterns are disposed in the scribe lane region.

16. The memory device according to claim 11,
- wherein each of the plurality of chip regions includes a cell region and a coupling region,
- wherein a plurality of interlayer dielectric layers and a plurality of electrode layers are alternately stacked and disposed in the cell region of the second wafer, and the plurality of interlayer dielectric layers and a plurality of dielectric layers are alternately stacked and disposed in the coupling region of the second wafer, and
- wherein the first and second test patterns are disposed in the coupling region.

17. The memory device according to claim 11,
- wherein each of the plurality of chip regions includes a cell region and a coupling region,
- wherein a plurality of interlayer dielectric layers and a plurality of electrode layers are alternately stacked and disposed in the cell regions of the second and third wafers, and a dielectric layer is disposed in the coupling region, of each of the second and third wafers, adjacent to the plurality of interlayer dielectric layers and the plurality of electrode layers alternately stacked and disposed in the respective cell regions of the second and third wafers, and
- wherein the first and second test patterns are disposed in the coupling region.

18. A memory system comprising:
- a memory device; and
- a memory controller,
- the memory device comprising:
- a first wafer including a first bonding pad disposed on a first surface;
- a second wafer stacked on the first surface of the first wafer in a vertical direction that is perpendicular to the first surface of the first wafer, including a second bonding pad disposed on a second surface of the second wafer corresponding to the first bonding pad, bonded on the first wafer such that the second bonding pad is aligned to the first bonding pad; and
- a first test pattern,
- the first test pattern comprising:
- a pair of first test pads disposed on the first surface and electrically coupled to each other;
- a pair of second test pads disposed on the second surface of the second wafer and respectively coupled to the pair of first test pads; and
- a pair of third test pads disposed on a third surface of the second wafer, which is opposite to the second surface in the vertical direction, and respectively coupled to the pair of second test pads,
- wherein the memory controller applies a test voltage to one of the pair of third test pads and generates a power-up signal based on a ratio between a detection voltage measured from the other third test pad and the test voltage, and
- wherein the first wafer provides a boosted voltage to the first bonding pad in response to the power-up signal.

19. The memory system according to claim 18, wherein the first wafer comprises:
- a voltage generator; and
- a voltage compensation circuit configured to boost a voltage generated in the voltage generator, in response to the power-up signal.

20. A method of detecting a pad misalignment in a memory device comprising:
providing
- a first wafer including a first bonding pad disposed on a first surface;
- a second wafer stacked on the first surface of the first wafer in a vertical direction that is perpendicular to the first surface of the first wafer, including a second bonding pad disposed on a second surface of the second wafer and corresponding to the first bonding pad, the second surface of the second wafer bonded on the first surface of the first wafer; and
- a first test pattern,
- the first test pattern comprising:
- a pair of first test pads disposed on the first surface and electrically coupled to each other;
- a pair of second test pads disposed on the second surface of the second wafer and respectively coupled to the pair of first test pads; and
- a pair of third test pads disposed on a third surface of the second wafer, which is opposite to the second surface in the vertical direction, and respectively coupled to the pair of second test pads;

applying a test signal to one of the pair of third test pads;
measuring an output signal from the other of the pair of third test pads; and
detecting a pad misalignment based on the output signal.

\* \* \* \* \*